(12) United States Patent
Xiong et al.

(10) Patent No.: US 8,969,971 B2
(45) Date of Patent: Mar. 3, 2015

(54) SEMICONDUCTOR DEVICES INCLUDING A RESISTOR STRUCTURE

(71) Applicant: Samsung Electronics Co., Ltd., Suwon-si (KR)

(72) Inventors: Junjie Xiong, Suwon-si (KR); Yoon-Hae Kim, Suwon-si (KR); Hong-Seong Kang, Hwaseong-si (KR); Yoon-Seok Lee, Seoul (KR); You-Shin Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/045,034

(22) Filed: Oct. 3, 2013

(65) Prior Publication Data
US 2014/0167180 A1   Jun. 19, 2014

(30) Foreign Application Priority Data
Dec. 13, 2012   (KR) .................... 10-2012-0145746

(51) Int. Cl.
*H01L 27/06* (2006.01)
(52) U.S. Cl.
CPC ........... *H01L 27/0629* (2013.01); *Y10S 257/90* (2013.01)
USPC ............ 257/379; 257/213; 257/413; 257/900
(58) Field of Classification Search
CPC ........................................................ H01L 27/06
USPC .................................. 257/379, 213, 413, 900
See application file for complete search history.

(56) References Cited

U.S. PATENT DOCUMENTS

| | | | |
|---|---|---|---|
| 6,156,602 A * | 12/2000 | Shao et al. ............... | 438/238 |
| 7,932,146 B2 | 4/2011 | Chen et al. | |
| 8,153,498 B2 | 4/2012 | Hsu et al. | |
| 2008/0258232 A1 | 10/2008 | Mizumura | |
| 2010/0328022 A1 | 12/2010 | Fan et al. | |
| 2011/0073957 A1 | 3/2011 | Chiu et al. | |
| 2011/0147853 A1 | 6/2011 | Lin et al. | |
| 2011/0186916 A1 | 8/2011 | Kurz et al. | |
| 2011/0303982 A1 | 12/2011 | Chung et al. | |
| 2012/0049291 A1 | 3/2012 | Scheiper et al. | |
| 2013/0270650 A1 * | 10/2013 | Tseng et al. ............... | 257/379 |
| 2013/0277750 A1 * | 10/2013 | Lai et al. .................. | 257/369 |
| 2014/0139295 A1 * | 5/2014 | Sun et al. ............... | 331/108 R |

FOREIGN PATENT DOCUMENTS

| | | |
|---|---|---|
| JP | 2011-100910 | 5/2011 |
| JP | 2011-204997 | 10/2011 |
| KR | 1020060007174 A | 1/2006 |

* cited by examiner

*Primary Examiner* — Marc Armand
(74) *Attorney, Agent, or Firm* — Myers Bigel Sibley & Sajovec, PA

(57) ABSTRACT

Semiconductor devices are provided. A semiconductor device may include a transistor area and a resistor area. The transistor area may include a gate structure. The resistor area may include an insulating layer and a resistor structure on the insulating layer. A top surface of the gate structure and a top surface of the resistor structure may be substantially coplanar.

16 Claims, 40 Drawing Sheets

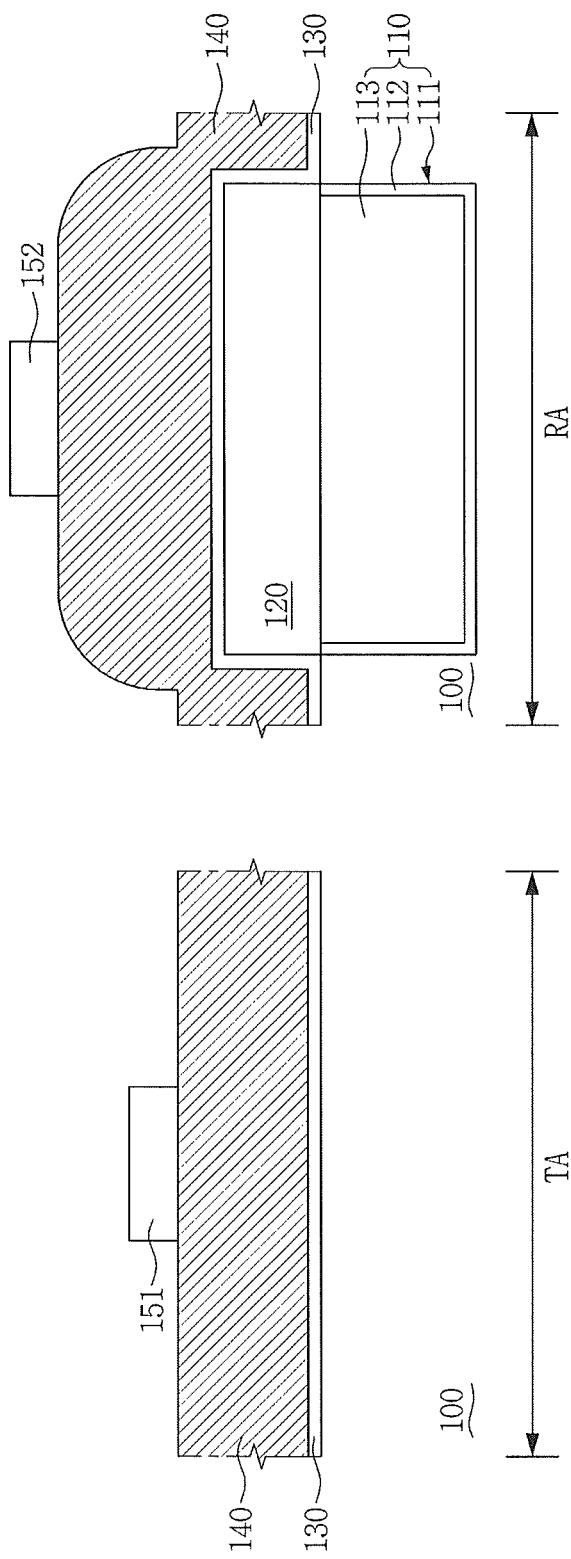

FIG. 4G
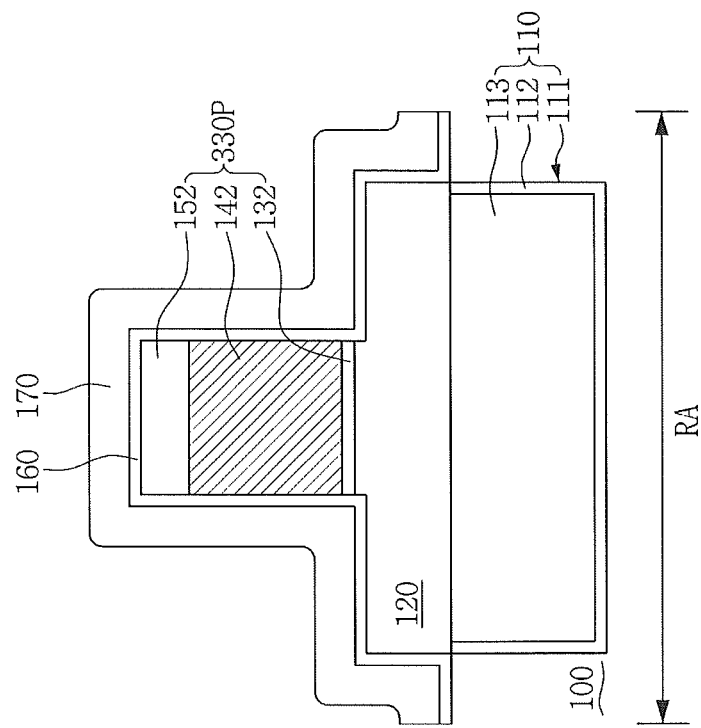
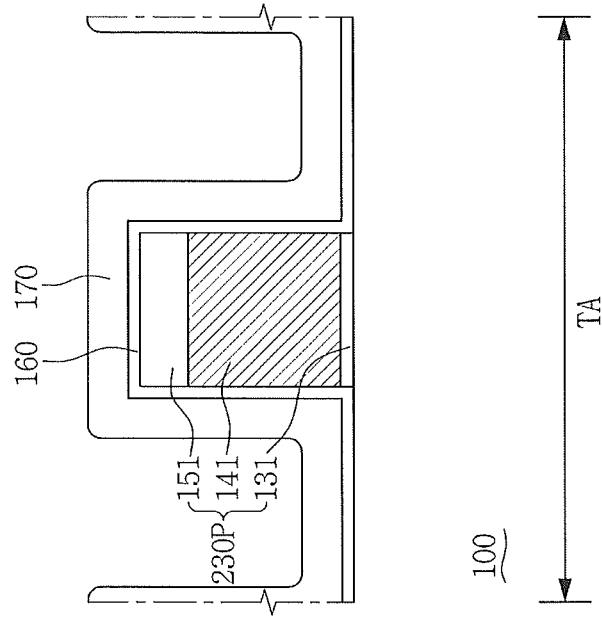

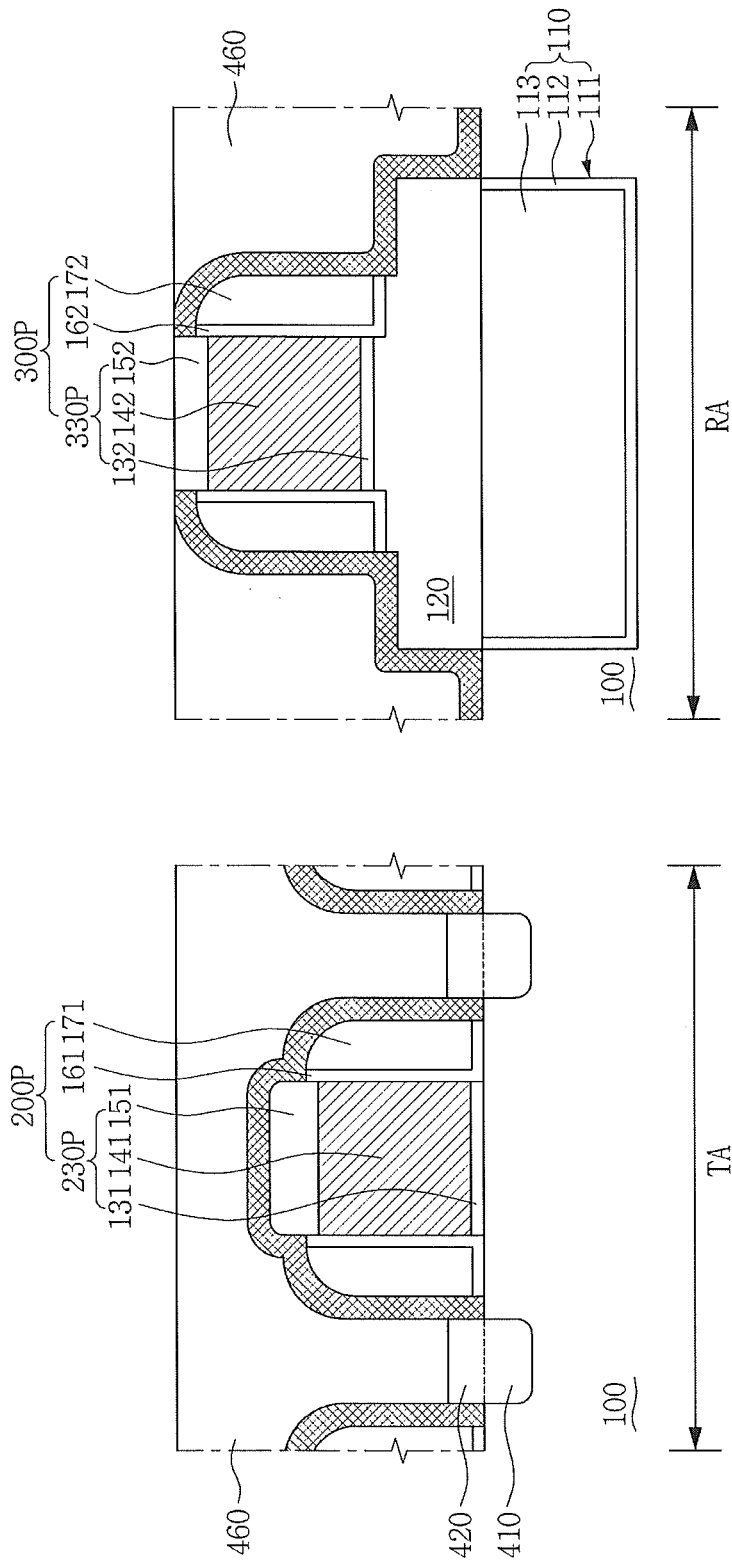

FIG. 4M
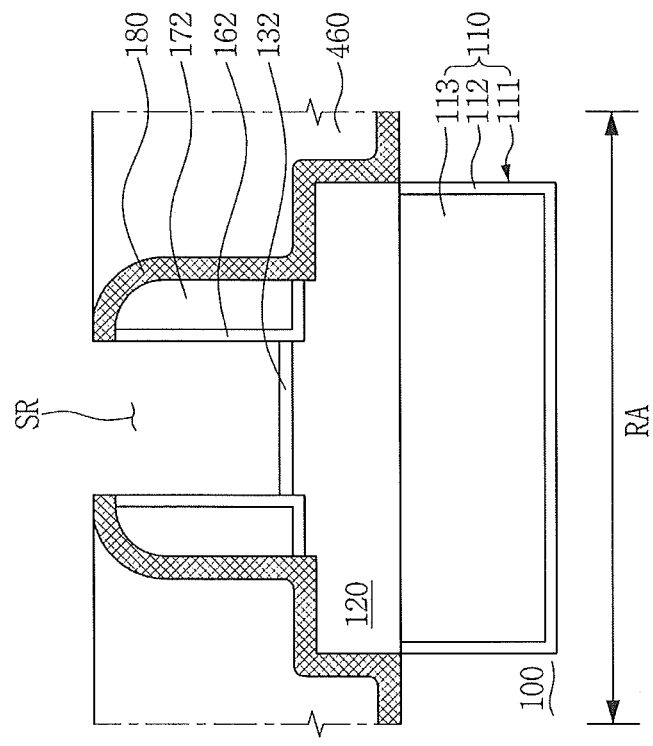
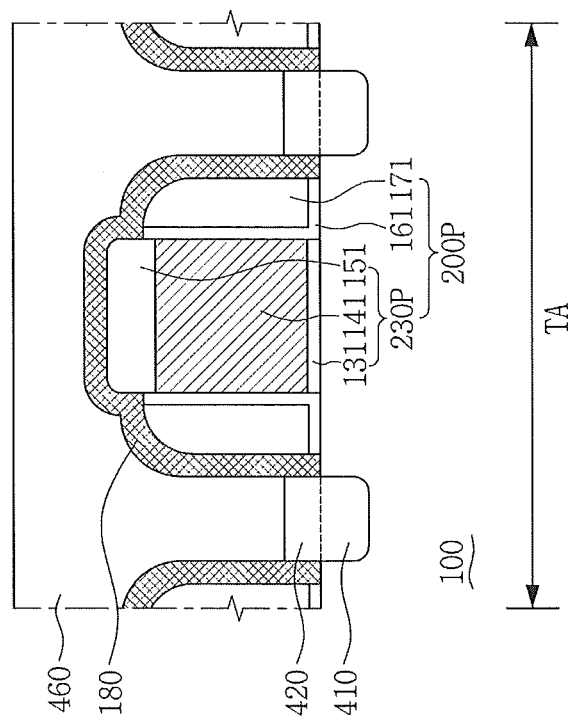

FIG. 4N
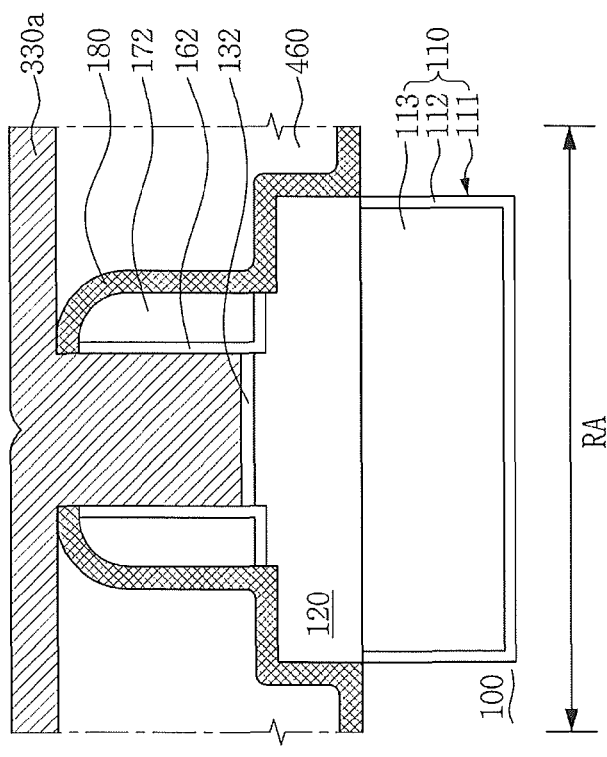
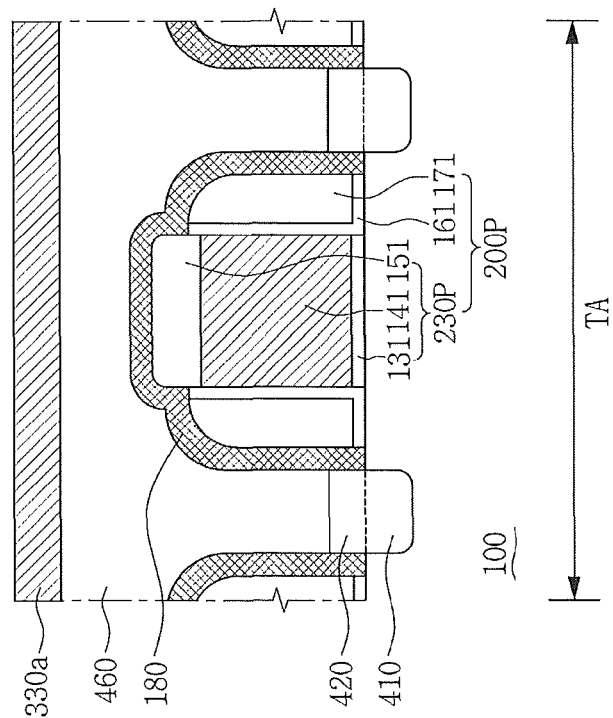

FIG. 40
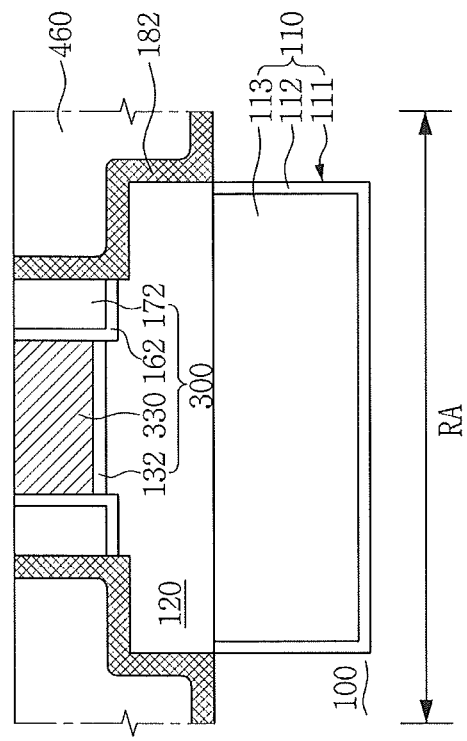
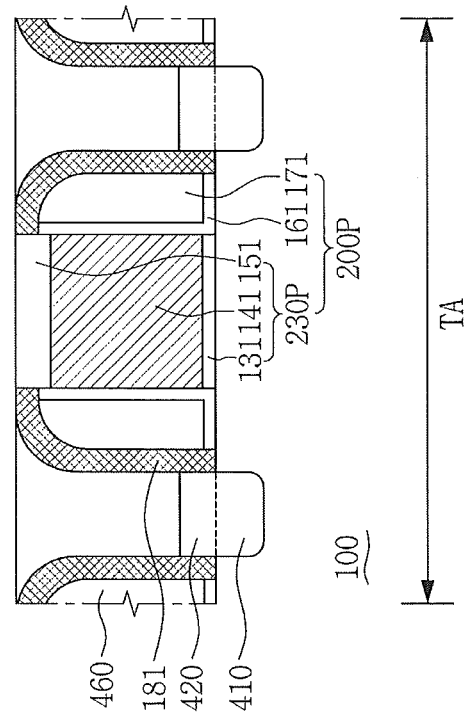

FIG. 4P
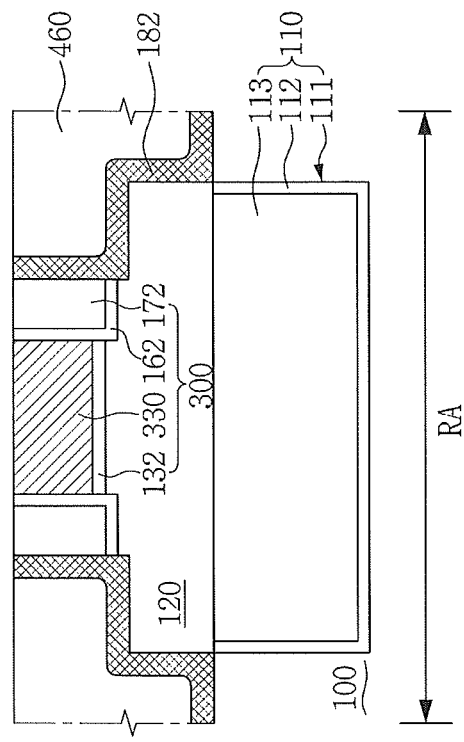
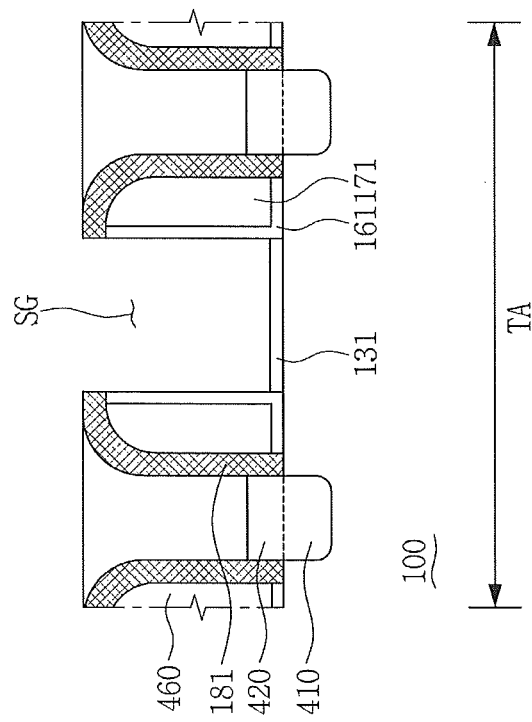

FIG. 4R
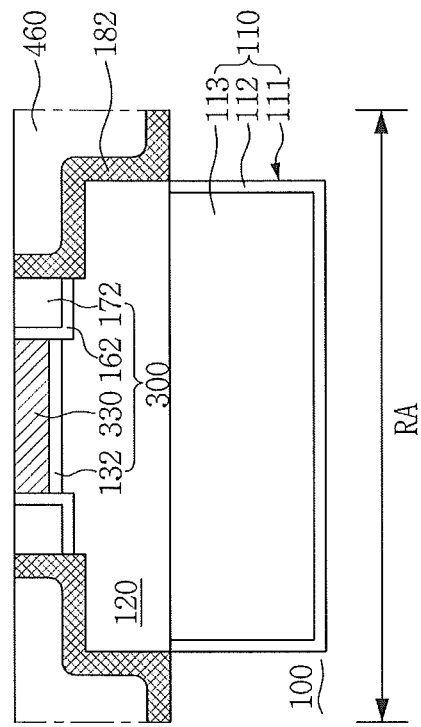
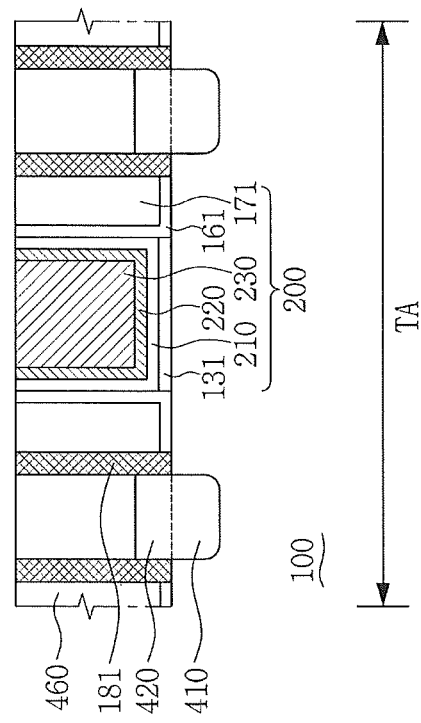

FIG. 5A
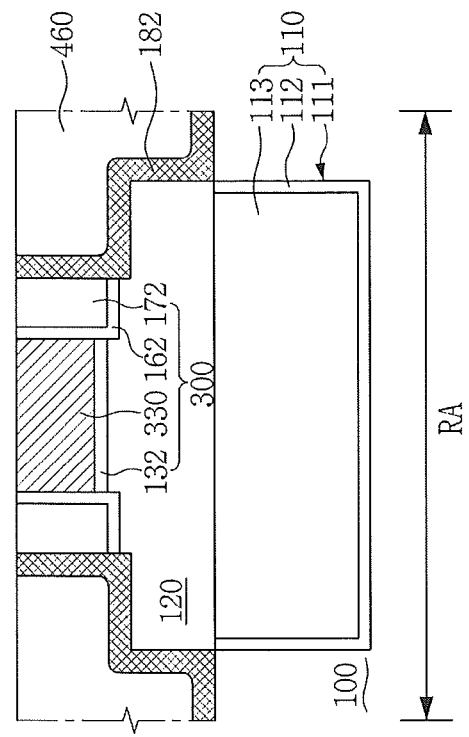
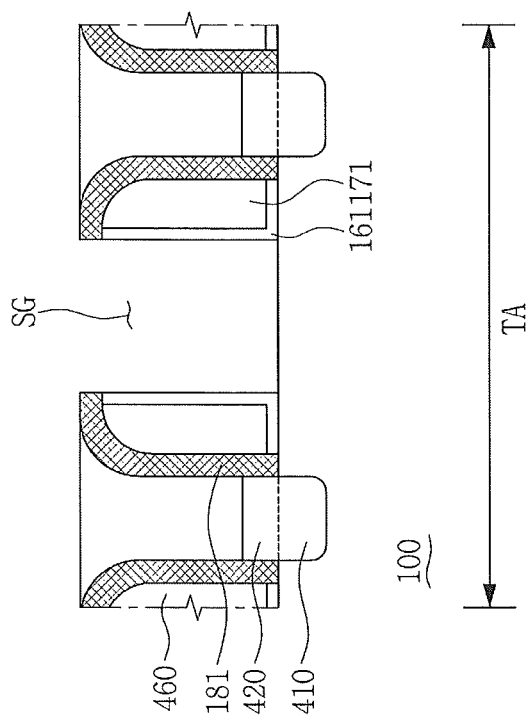

FIG. 5B
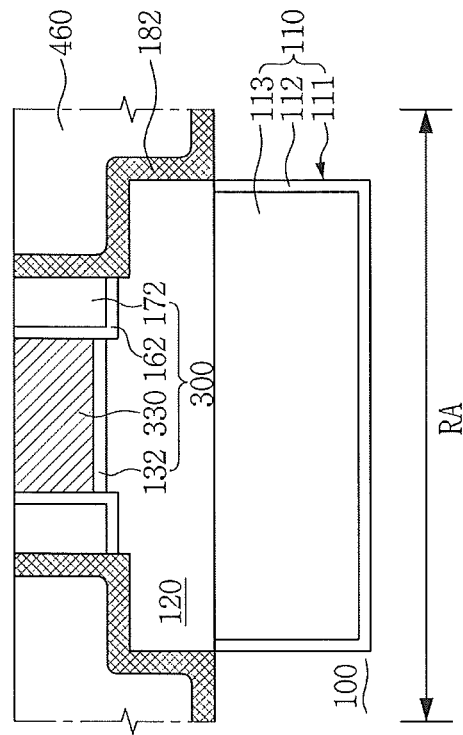
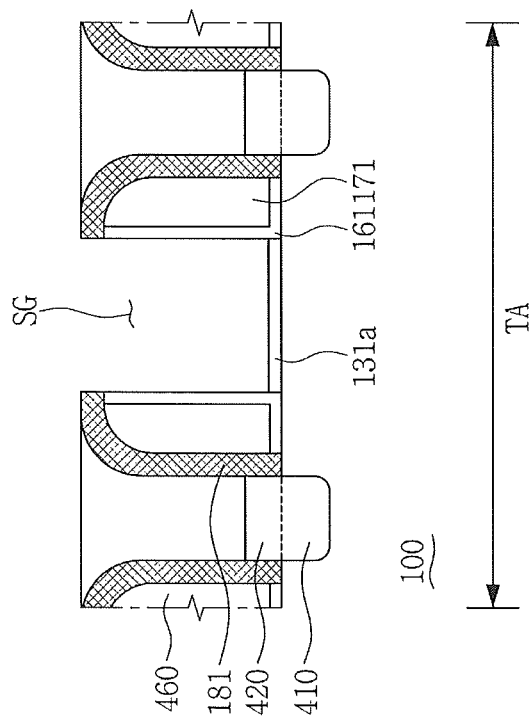

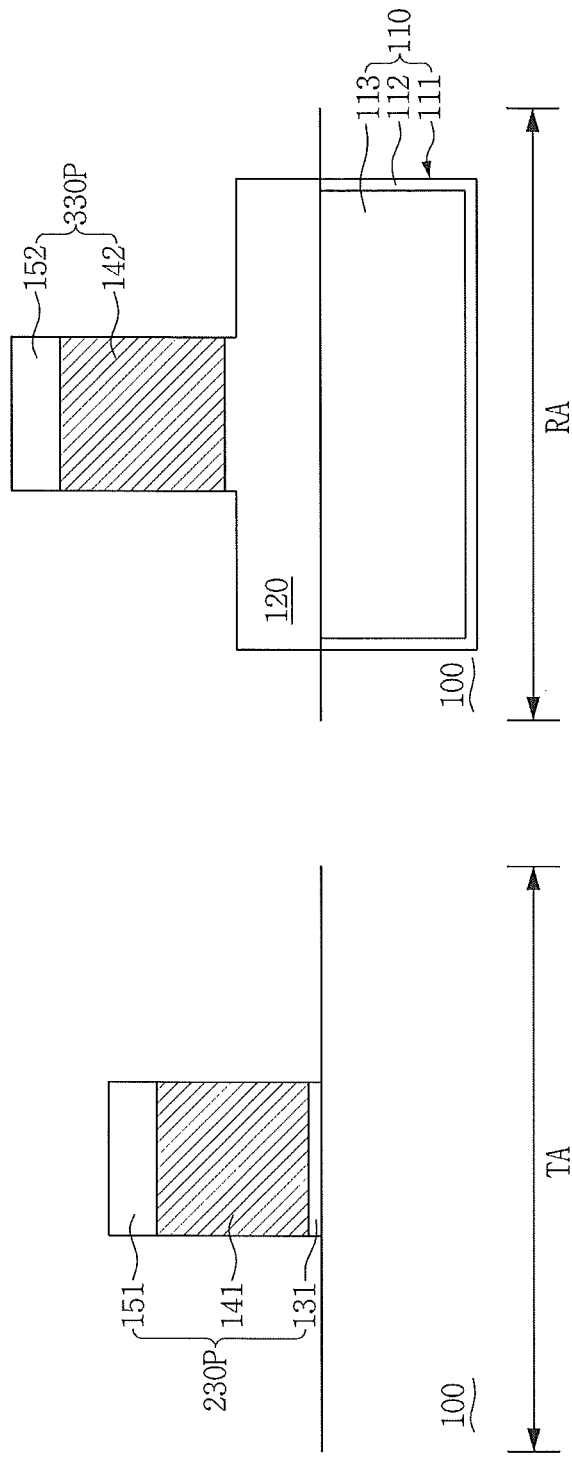

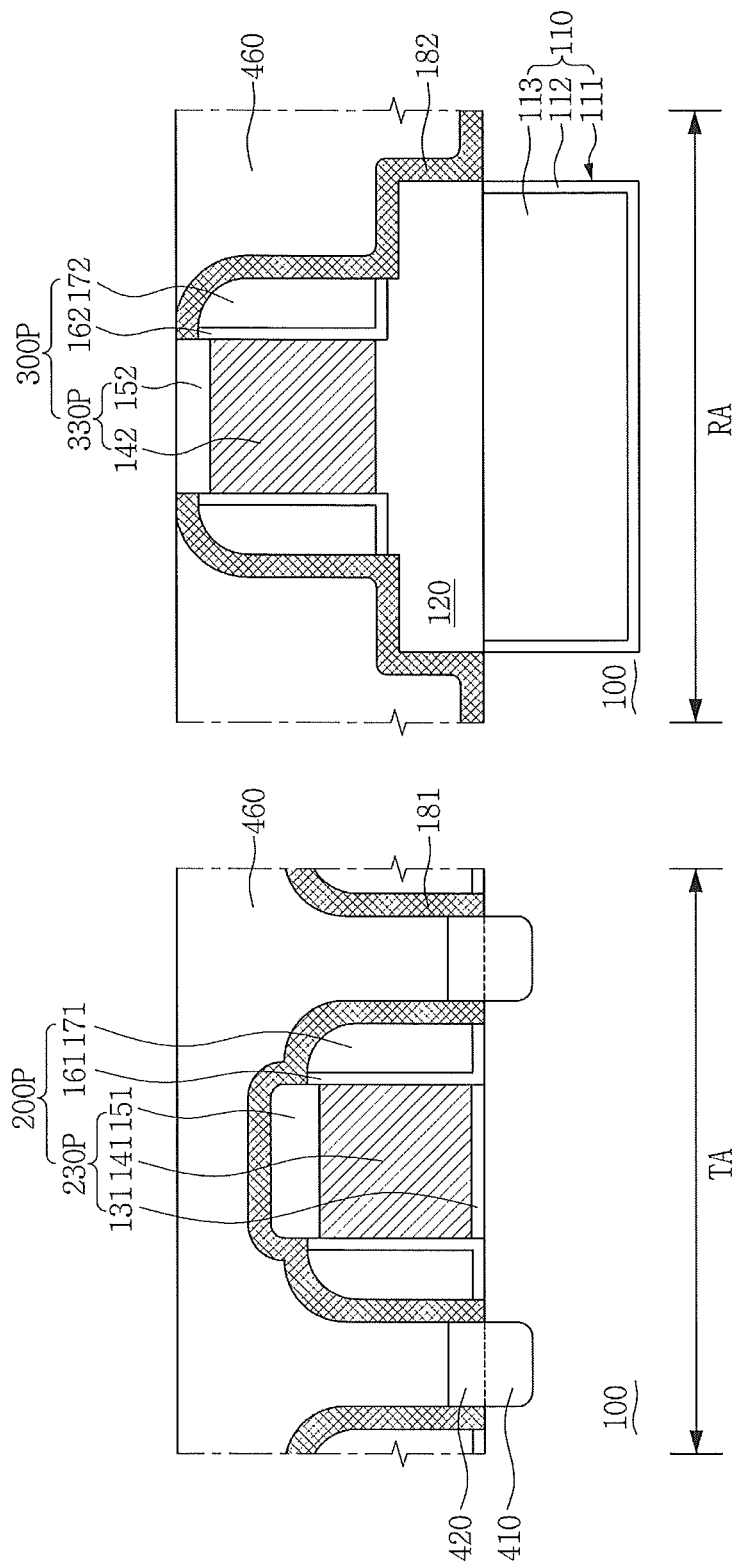

FIG. 6E
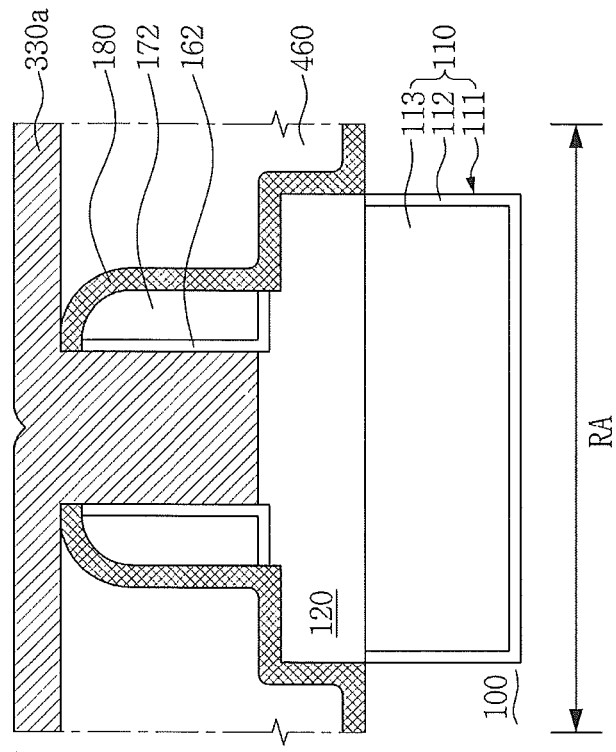
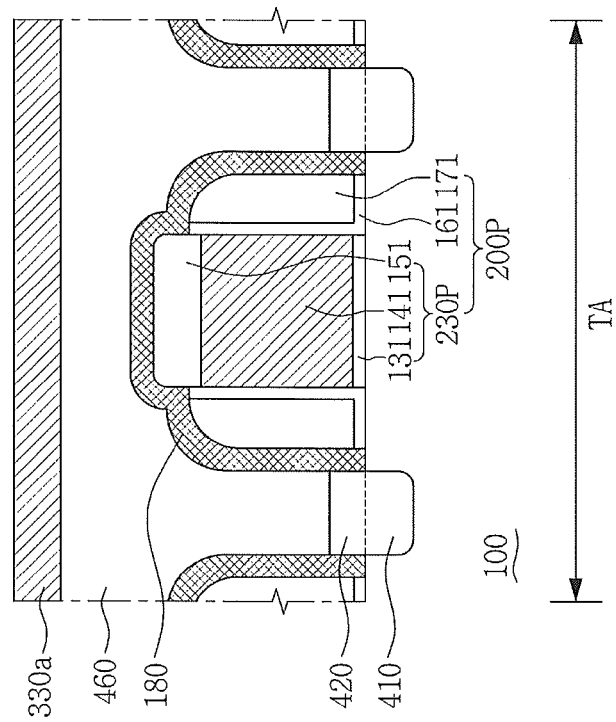

FIG. 6F
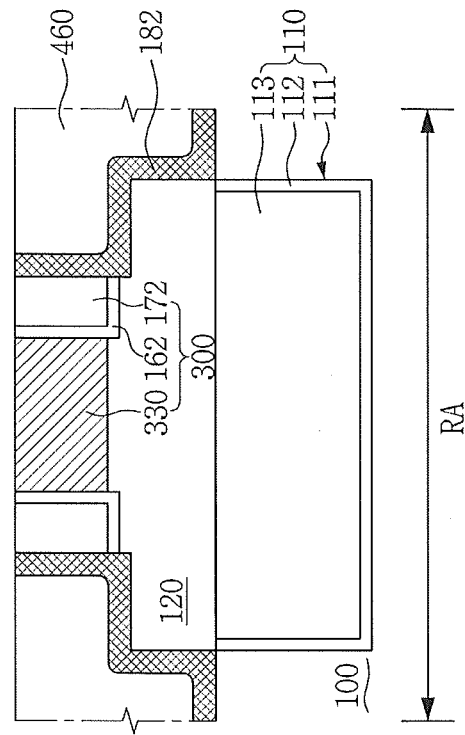
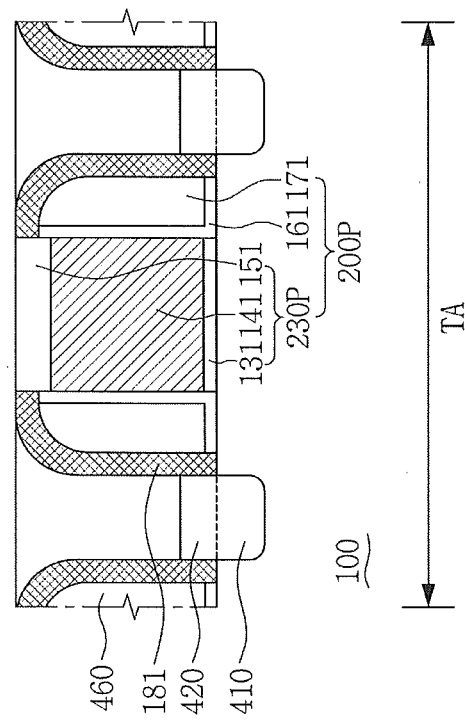

FIG. 6G
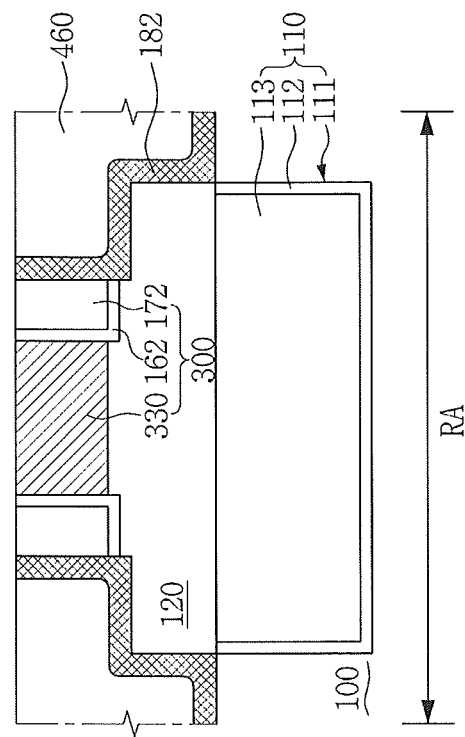
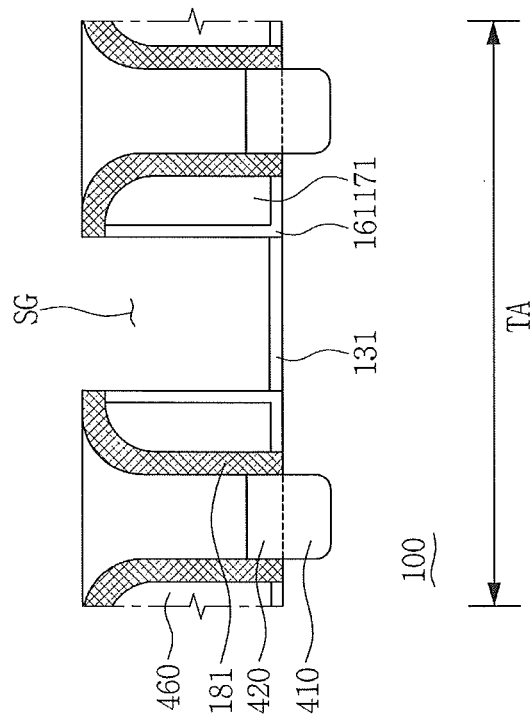

FIG. 6H
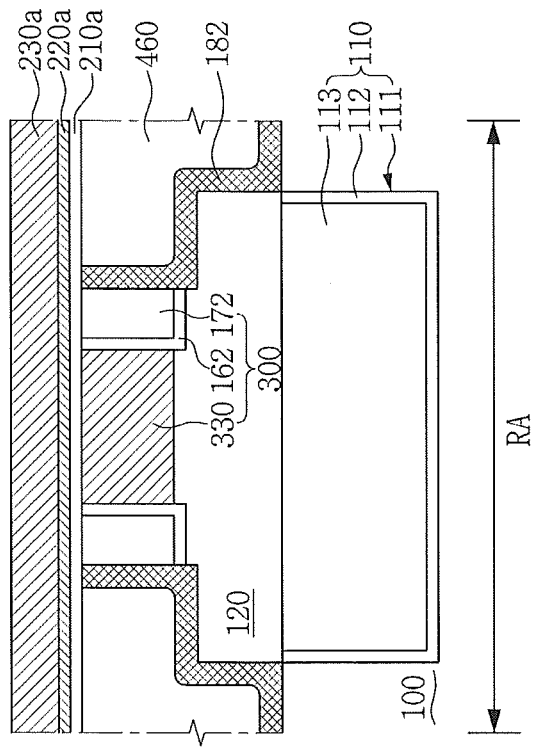
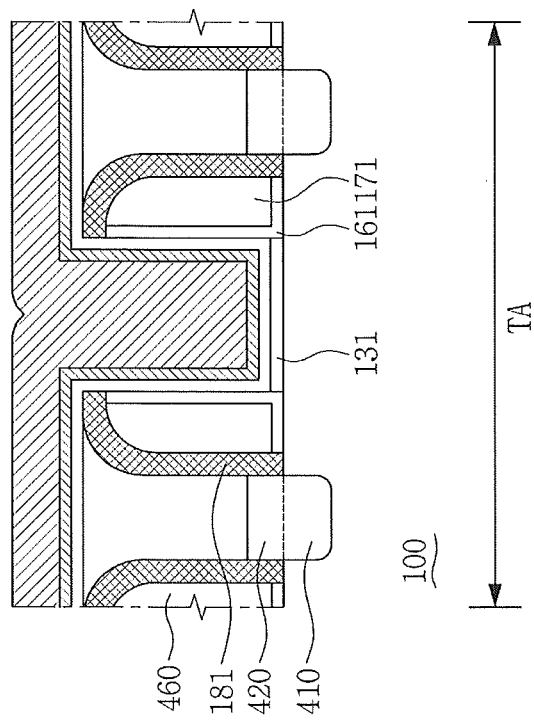

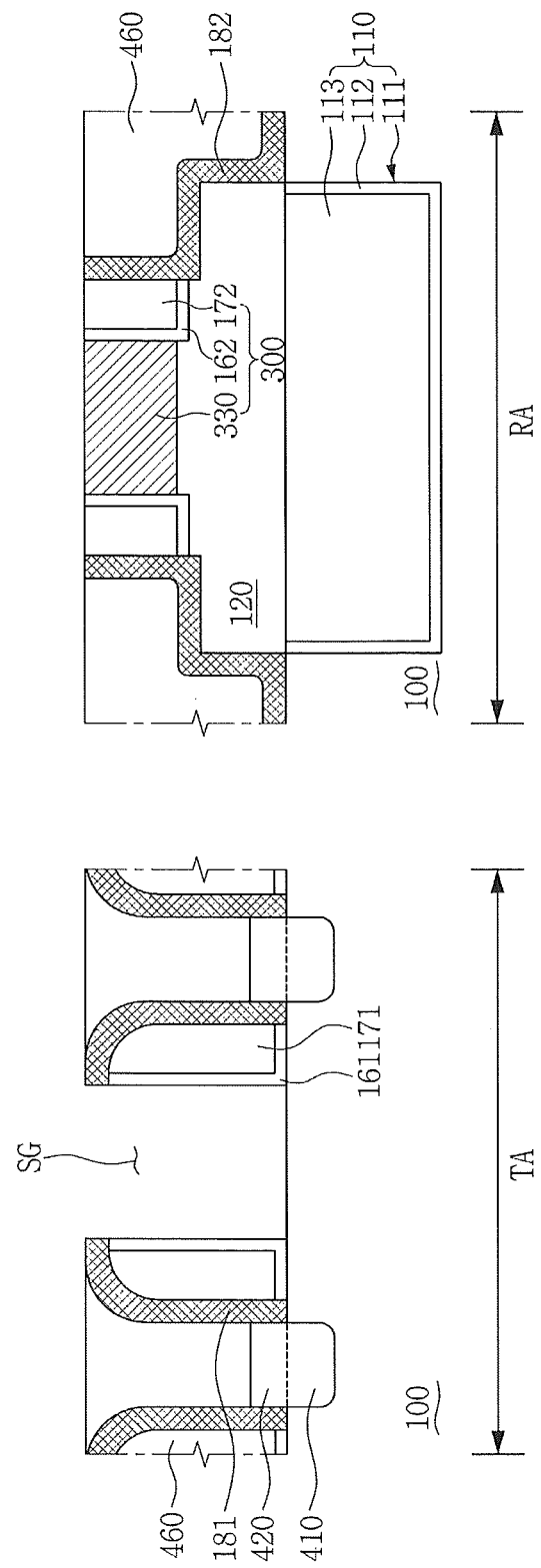

FIG. 7B
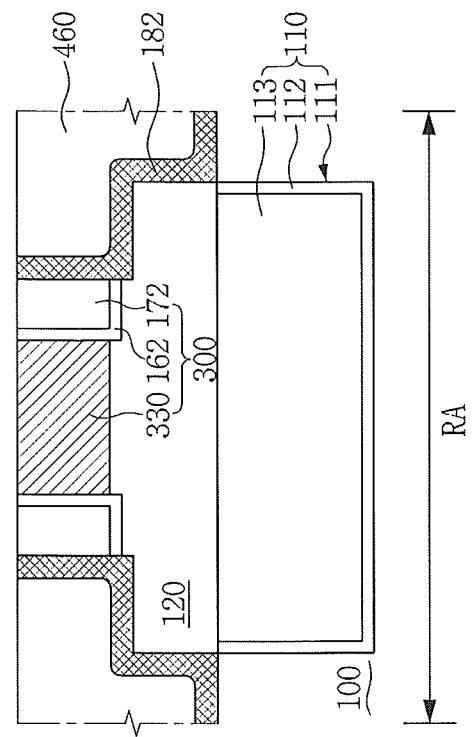
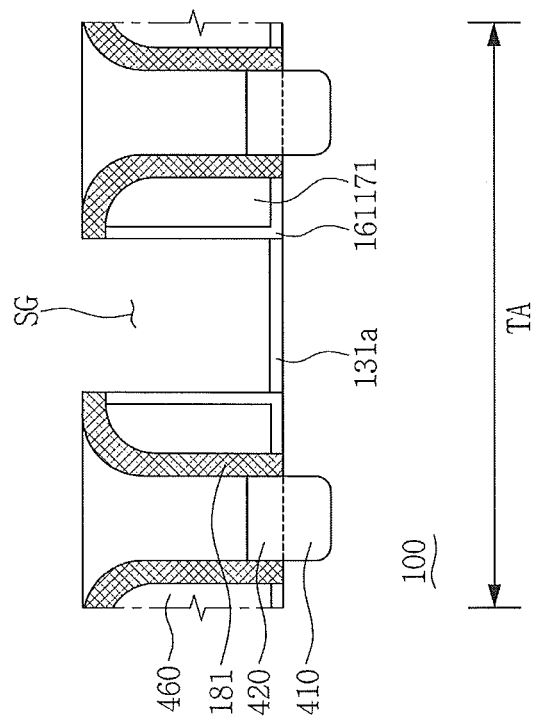

SEMICONDUCTOR DEVICES INCLUDING A RESISTOR STRUCTURE

CROSS-REFERENCE TO RELATED APPLICATION

This U.S. non-provisional patent application claims priority under 35 U.S.C. §119 to Korean Patent Application No. 10-2012-0145746, filed on Dec. 13, 2012, the disclosure of which is hereby incorporated herein by reference in its entirety.

BACKGROUND

The present disclosure relates to semiconductor devices. As the integration of a semiconductor device increases, components of the semiconductor device may decrease in size.

SUMMARY

Various embodiments of the present inventive concepts provide a semiconductor device. The semiconductor device may include a transistor area and a resistor area. The transistor area may include an active region in a substrate, and a gate structure on the active region. The resistor area may include a base insulating layer on a surface of the substrate, and a resistor structure on the base insulating layer. A top surface of the gate structure and a top surface of the resistor structure may be substantially coplanar. In some embodiments, the semiconductor device may include a field region in the substrate, and the base insulating layer may be on the field region.

In various embodiments, the resistor structure may include a conductive resistor electrode on the base insulating layer and an insulating resistor spacer on a side surface of the resistor electrode. The resistor structure may include a resistor surface insulating layer between the base insulating layer and the resistor electrode, and the resistor surface insulating layer may include silicon oxide. In some embodiments, the resistor spacer may include an inner resistor spacer and an outer resistor spacer. The inner resistor spacer may directly contact the side surface of the resistor electrode and extend onto a top surface of the base insulating layer. Moreover, the outer resistor spacer may include silicon nitride and may be on a side surface of the inner resistor spacer.

According to various embodiments, the resistor area may include a resistor capping layer on a side surface of the resistor spacer, and on a side surface and a part of a top surface of the base insulating layer. In some embodiments, the resistor capping layer may extend onto the surface of the substrate and may include silicon oxide. In some embodiments, the base insulating layer may include a first surface contacting the resistor capping layer, a second surface contacting the resistor spacer, and a third surface overlapped by the resistor electrode. The first surface may be lower than the second surface, and the third surface may be higher than the second surface.

In various embodiments, the gate structure may include a gate electrode, a U-shape gate insulating layer between the substrate and the gate electrode, and a gate spacer on a side surface of the gate insulating layer. In some embodiments, the gate structure may include a gate surface insulating layer between the surface of the substrate and the gate insulating layer. In some embodiments, the gate insulating layer may include a metal oxide, and the gate surface insulating layer may include oxidized silicon. In some embodiments, the gate spacer may include an inner gate spacer directly on a side surface of the gate insulating layer and an outer gate spacer on a side surface of the inner gate spacer. The outer gate spacer may include silicon nitride.

A semiconductor device, according to various embodiments, may include a substrate including an active region and a field region. The semiconductor device may include a gate structure on the active region. The gate structure may include a conductive gate electrode, a gate insulating layer on a bottom surface and side surfaces of the gate electrode, and an insulating gate spacer on an outer side surface of the gate insulating layer. The semiconductor device may include a source/drain area in the active region and adjacent a side of the gate structure. The semiconductor device may include a base insulating layer on the field region. The semiconductor device may include a resistor structure on the base insulating layer. The resistor structure may include a conductive resistor electrode and an insulating resistor spacer on a side surface of the resistor electrode. The gate electrode may be thicker than the resistor electrode.

In various embodiments, the gate structure may include a gate surface insulating layer between a surface of the substrate and the gate insulating layer. The gate structure may include a gate barrier layer between the gate insulating layer and the gate electrode. The gate surface insulating layer may extend in a horizontal direction, and the gate barrier layer may be on the bottom and side surfaces of the gate electrode. The resistor structure may include a resistor surface insulating layer between the base insulating layer and the resistor electrode, and extending in a horizontal direction. In some embodiments, the side surface of the resistor electrode may directly contact the resistor spacer.

A semiconductor device, according to various embodiments, may include a substrate including a transistor area and a resistor area. The semiconductor device may include a gate electrode on the substrate in the transistor area. The semiconductor device may include a resistor electrode on the substrate in the resistor area. The resistor electrode may include an uppermost surface substantially coplanar with an uppermost surface of the gate electrode. Moreover, the resistor electrode may include a thinner thickness than a thickness of the gate electrode. The semiconductor device may include an insulating layer between the resistor electrode and a surface of the substrate. In some embodiments, the insulating layer may include an uppermost surface that is higher than a lowermost surface of the gate electrode, relative to the surface of the substrate.

In various embodiments, the insulating layer may include a first insulating layer, and the semiconductor device may include a second insulating layer between the gate electrode and the surface of the substrate. Moreover, the first insulating layer may include a wider width than a width of the second insulating layer, and a thicker thickness than a thickness of the second insulating layer. In some embodiments, the semiconductor device may include a third insulating layer between the first insulating layer and the resistor electrode, where the width of the first insulating layer may be wider than a width of the third insulating layer, and where the thickness of the first insulating layer may be thicker than a thickness of the third insulating layer.

According to various embodiments, the first insulating layer may directly contact the surface of the substrate. In some embodiments, the semiconductor device may include a spacer on the resistor electrode and a resistor capping layer adjacent the spacer. Moreover, the first insulating layer may directly contact the spacer and the resistor capping layer. In some embodiments, the resistor electrode may include a metal.

BRIEF DESCRIPTION OF THE DRAWINGS

The above and other features and advantages of the disclosure will become more apparent in view of the attached drawings and accompanying detailed description.

FIGS. 4A to 7B are schematic cross-sectional views taken along lines I-I' and II-II' of FIG. 1 illustrating methods of forming semiconductor devices in accordance with various embodiments.

DETAILED DESCRIPTION

Figure 1:
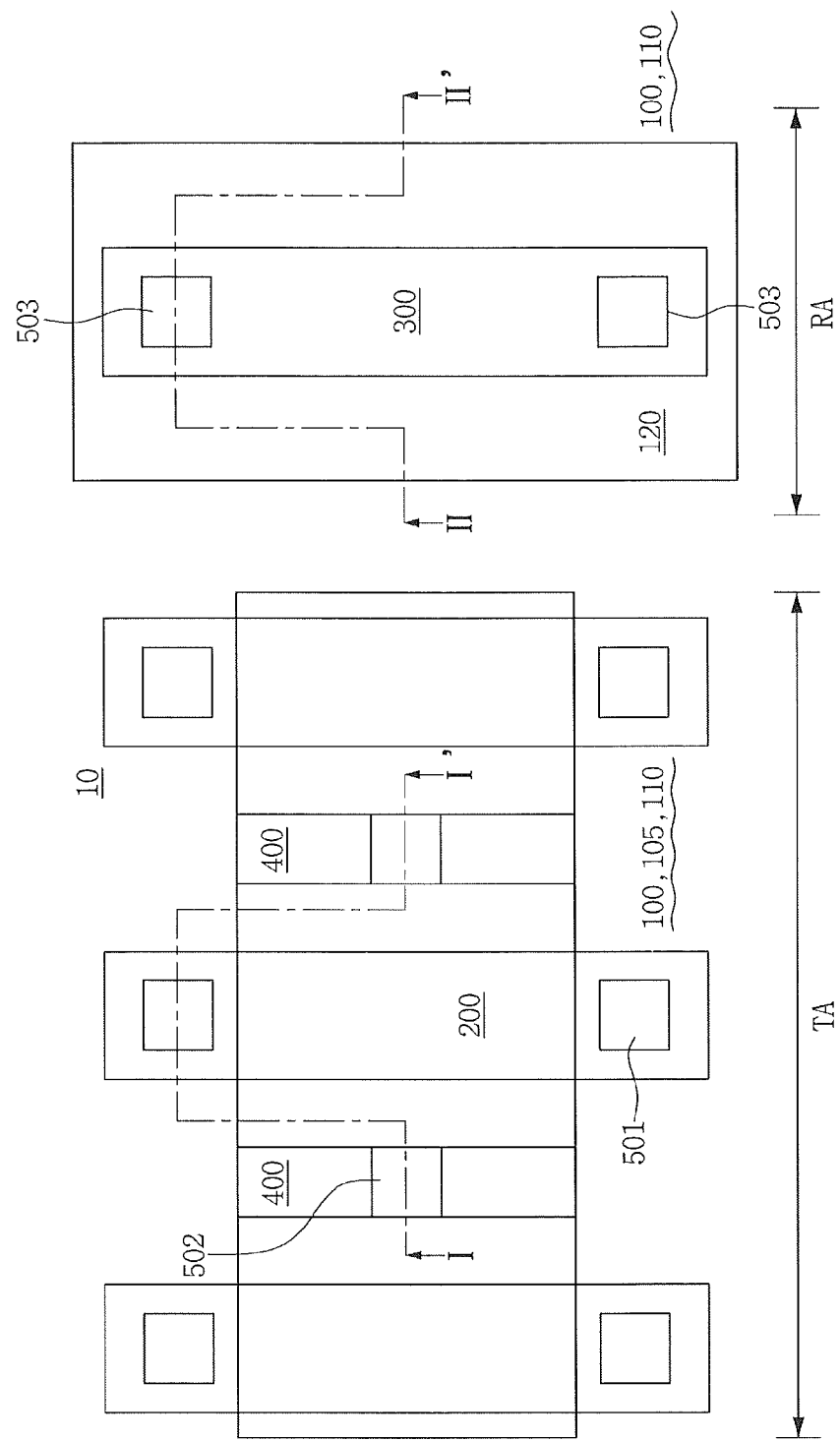
FIG. 1 is a schematic layout view of a semiconductor device in accordance with various embodiments of the present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a schematic layout view of a semiconductor device 10 in accordance with various embodiments of the present inventive concepts. Referring to FIG. 1, the semiconductor device 10 may include a transistor area TA and a resistor area RA.

The transistor area TA may include an active region 105 surrounded by a field region 110, a gate electrode 200 arranged on the field region 110 and the active region 105, and source/drain areas 400 arranged in the active region 105. The transistor area TA may further include a gate contact plug 501 overlapping the gate electrode 200, and a source/drain contact plug 502 overlapping the source/drain areas 400.

The resistor area RA may include a base insulating layer 120 on the field region 110, and a resistor electrode 300 on the base insulating layer 120. The resistor area RA may further include a resistor contact plug 503 overlapping the resistor electrode 300.

Figure 2:
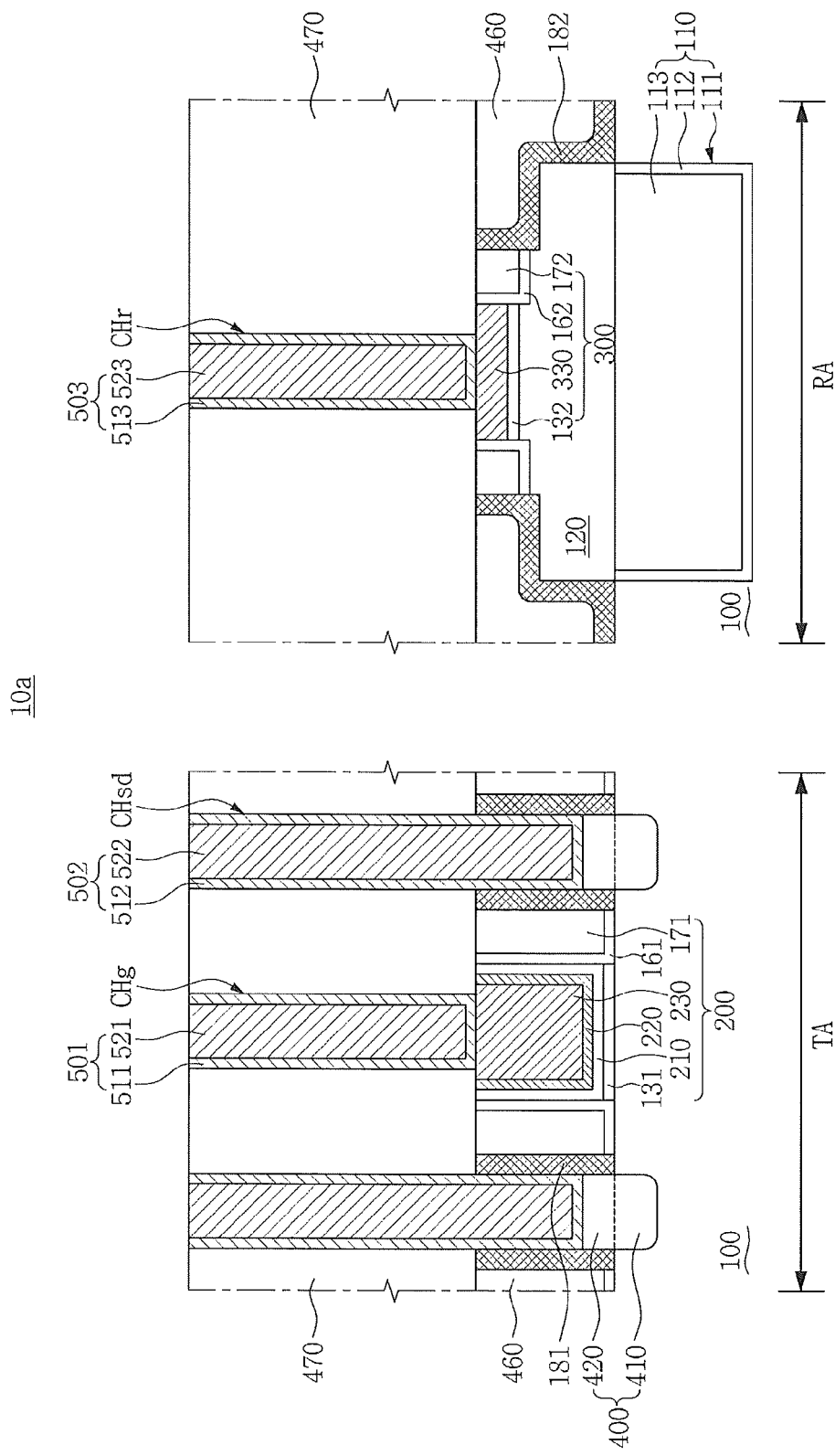
FIGS. 2 and 3 are schematic cross-sectional views of semiconductor devices taken along lines I-I' and II-II' of FIG. 1 in accordance with various embodiments.
Figure 3:
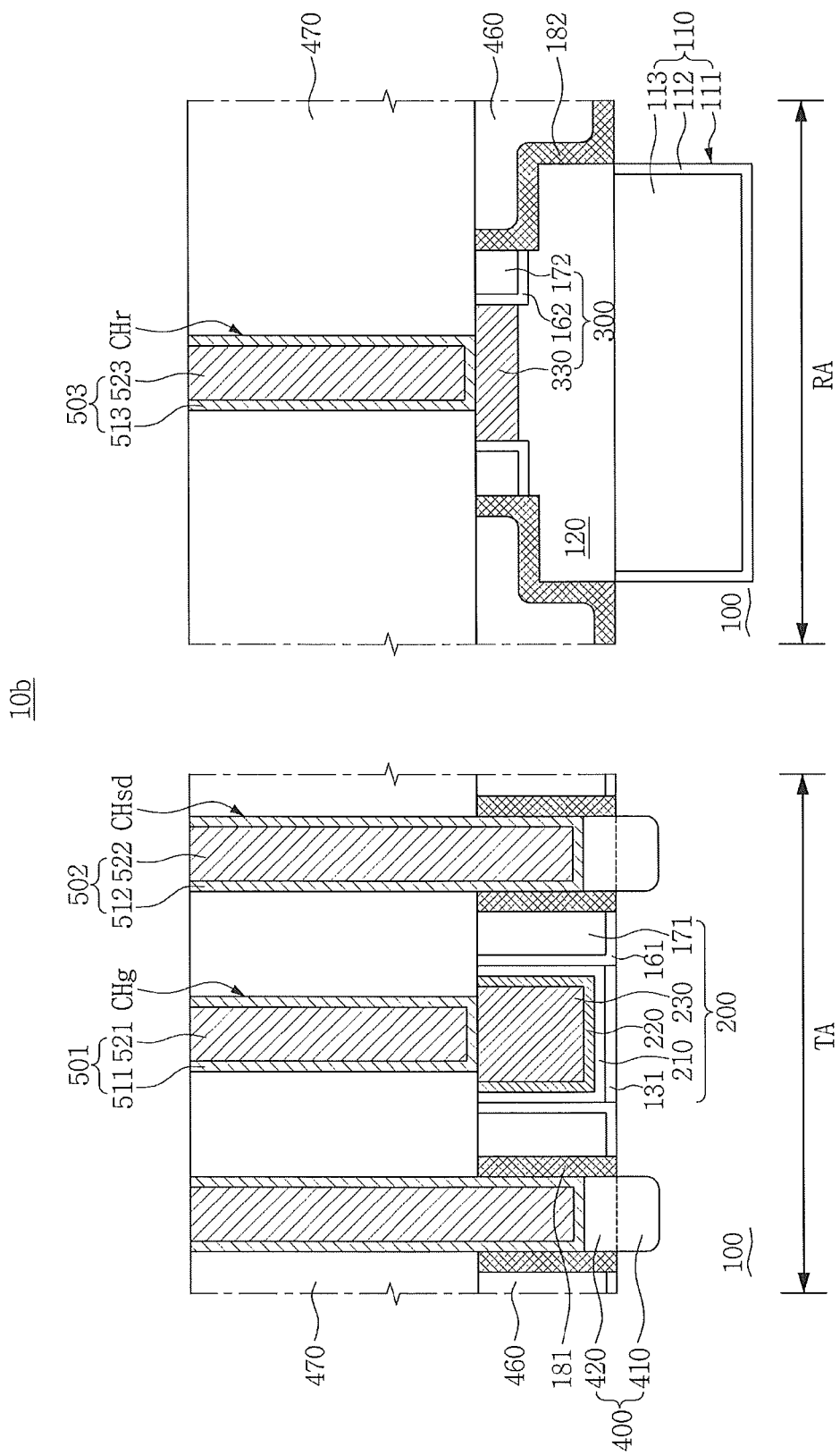

FIGS. 2 and 3 are schematic cross-sectional views of respective semiconductor devices 10a and 10b taken along lines I-I' and II-II' of FIG. 1 in accordance with various embodiments. Referring to FIGS. 1 and 2, the semiconductor device 10a may include a transistor area TA and a resistor area RA. The transistor area TA may include a gate structure 200, a source/drain area 400, a gate contact structure 501, and a source/drain contact structure 502 which are arranged in the substrate 100. The resistor area RA may include a base insulating layer 120 arranged on the substrate 100 and/or the field region 110, a resistor structure 300 on the base insulating layer 120, and a resistor contact structure 503 on the resistor structure 300.

The substrate 100 may include a bulk silicon wafer or a silicon-on-insulator (SOI) wafer. The field region 110 may include a field trench 111, a field liner 112, and a field insulating material 113. The field trench 111 may be formed in a trench shape in the substrate 100, the field liner 112 may be conformally formed on an inner wall or bottom surface of the field trench 111, and the field insulating material 113 may be formed on the field liner 112 to fill the field trench 111. The field liner 112 may include oxidized silicon, silicon nitride, or a combination thereof. The field insulating material 113 may include a flowable oxide such as undoped silicate glass (USG) or tonen silazene (TOSZ).

The gate structure 200 may include a gate surface insulating layer 131, a gate insulating layer 210, a gate barrier layer 220, a gate electrode 230, an inner gate spacer 161, and an outer gate spacer 171. The gate surface insulating layer 131 may be directly formed on the substrate 100. The gate surface insulating layer 131 may include silicon oxide. The gate surface insulating layer 131 may extend in a horizontal direction. For example, the gate surface insulating layer 131 may have a "-"-shape.

The gate insulating layer 210 may be directly formed on the gate surface insulating layer 131. The gate insulating layer 210 may include a metal oxide such as Hafnium Oxide (HfO), Lanthanum Oxide (LaO), and Aluminum Oxide (AlO). The gate barrier layer 220 may be conformally formed on inner walls and a bottom surface of the gate insulating layer 210. The gate barrier layer 220 may include Titanium (Ti), Titanium Nitride (TiN), Tantalum (Ta), Tantalum Nitride (TaN), Titanium Tungsten (TiW), or another barrier metal.

The gate electrode 230 may include a metal such as Tungsten (W), Copper (Cu), Nickel (Ni), Cobalt (Co), Aluminum (Al), Titanium (Ti), and Tantalum (Ta), or a metal compound such as a metal nitride. The gate electrode 230 may be formed in a multilayer. For example, the gate electrode 230 may include multilayered metal layers, alloy layers, or metal compound layers. The gate insulating layer 210 may have a "U"-shape to surround side and bottom surfaces of the gate barrier layer 220. The gate barrier layer 220 may also have a "U"-shape to surround side and bottom surfaces of the gate electrode 230.

The inner gate spacer 161 may be directly formed on outer walls of the surface insulating layer 131 and the gate insulating layer 210. The inner gate spacer 161 may have an "L"-shape to extend onto a surface of the substrate 100. The inner gate spacer 161 may include silicon oxide.

The outer gate spacer 171 may be directly formed on an outer wall of the inner gate spacer 161 and on portions of the inner gate spacer 161 extending onto the surface of the substrate 100. The outer gate spacer 171 may include silicon nitride.

The inner gate spacer 161 and the outer gate spacer 171 may have the same upper level. For example, the upper surface of the outer gate spacer 171 and the upper surface of the inner gate spacer 161 may be horizontally aligned. An outer side surface of the inner gate spacer 161 and an outer side surface of the outer gate spacer 171 may be vertically aligned.

The source/drain area 400 may be formed outside of the outer gate spacer 171. The source/drain area 400 may include an upper source/drain area 420 formed on a lower source/drain area 410 to be higher than a surface of the lower source/drain area 410 formed in the substrate 100. The source/drain area 400 may include impurity atoms such as Phosphorus (P), Arsenic (As), or Boron (B).

A gate capping layer 181 may be formed between the outer gate spacer 171 and the source/drain area 400. The gate capping layer 181 may be in direct contact with the outer gate spacer 171, the substrate 100, and the upper source/drain area 420. The gate capping layer 181 may include silicon oxide.

A lower interlayer insulating layer 460 may cover side surfaces of the gate structure 200, the gate capping layer 181, and the source/drain areas 400. For example, a top of the lower interlayer insulating layer 460 and a top of the gate structure 200 may be located at the same level. The lower interlayer insulating layer 460 may include silicon oxide.

An upper interlayer insulating layer 470 may cover an upper surface of the gate structure 200 and the lower interlayer insulating layer 460. The upper interlayer insulating layer 470 may also include silicon oxide.

The gate contact structure 501 may vertically pass through the upper interlayer insulating layer 470 to be in contact with the gate electrode 230. The gate contact structure 501 may include a gate contact barrier layer 511 and a gate contact plug 521. The gate contact barrier layer 511 may be conformally formed on an inner wall of a gate contact hole CHg and on the gate electrode 230. The gate contact barrier layer 511 may include Ti, TiN, Ta, TaN, TiW, or another barrier metal. The gate contact plug 521 may be formed on the gate contact barrier layer 511 to fill the gate contact hole CHg. The gate contact plug 521 may include a metal such as W, Cu, Ni, Co, Al, Ti, and Ta, and/or a metal compound such as a metal nitride.

The source/drain contact structure 502 may vertically pass through the upper interlayer insulating layer 470 and the lower interlayer insulating layer 460 to be in contact with the upper source/drain area 420. The source/drain contact structure 502 may include a source/drain contact barrier layer 512 and a source/drain contact plug 522. The source/drain contact barrier layer 512 may be conformally formed on an inner wall of a source/drain contact hole CHsd and on the upper source/drain area 420. The source/drain contact barrier layer 512 may include Ti, TiN, Ta, TaN, TiW, or another barrier metal. The source/drain contact plug 522 may be formed on the source/drain contact barrier layer 512 to fill the source/drain contact hole CHsd. The source/drain contact plug 522 may include a metal such as W, Cu, Ni, Co, Al, Ti, and Ta, and/or a metal compound such as a metal nitride.

The base insulating layer 120 may be directly formed on the substrate 100 and/or the field region 110. The base insulating layer 120 may include a High Density Plasma (HDP) oxide formed by performing a high-density plasma process. The base insulating layer 120 may provide an elevated surface on the resistor area RA.

The resistor structure 300 may be formed on the base insulating layer 120. The resistor structure 300 may include a resistor surface insulating layer 132, a resistor electrode 330, an inner resistor spacer 162, and an outer resistor spacer 172.

The resistor surface insulating layer 132 may be directly formed on the base insulating layer 120. The resistor surface insulating layer 132 may extend in a horizontal direction. For example, the resistor surface insulating layer 132 may have a "-"-shape.

The resistor electrode 330 may be formed on the resistor surface insulating layer 132. The resistor electrode 330 may include a metal, a metal silicide, or a metal compound. The resistor electrode 330 may be formed of a single material.

The inner resistor spacer 162 may be conformally formed on a side surface of the resistor surface insulating layer 132, a side surface of the resistor electrode 330, and a part of a surface of the base insulating layer 120. The inner resistor spacer 162 may include oxidized silicon or silicon oxide.

The outer resistor spacer 172 may be directly formed on an outer wall of the inner resistor spacer 162 and on portions of the inner resistor spacer 162 extending on the surface of the base insulating layer 120. The outer resistor spacer 172 may include silicon nitride.

The inner resistor spacer 162 and the outer resistor spacer 172 may have the same top level. For example, the top of the inner resistor spacer 162 and the top of the outer resistor spacer 172 may be horizontally aligned. An outer side surface of the inner resistor spacer 162 and an outer side surface of the outer resistor spacer 172 may be vertically aligned.

A resistor capping layer 182 may cover the surface of the substrate 100, side surfaces and a part of the upper surface of the base insulating layer 120, and side surfaces of the resistor structure 300. The lower interlayer insulating layer 460 may cover the resistor capping layer 182. The upper interlayer insulating layer 470 may cover an upper surface of the resistor structure 300, the resistor capping layer 182, and the lower interlayer insulating layer 460.

A surface of the base insulating layer 120 that the resistor structure 300 occupies may be elevated higher than surrounding surfaces of the base insulating layer 120. For example, a surface of the base insulating layer 120 that is in contact with the resistor capping layer 182 may be located at the lowest level among surface levels of the base insulating layer 120.

A surface of the base insulating layer 120 that the inner resistor spacer 162 occupies may be recessed to be lower than a surface of the base insulating layer 120 that is in contact with the resistor surface insulating layer 132. For example, the surface of the base insulating layer 120 in contact with the resistor surface insulating layer 132 may be located at the highest level among surface levels of the base insulating layer 120.

The resistor contact structure 503 may vertically pass through the upper interlayer insulating layer 470 to be in contact with the resistor electrode 330. The resistor contact structure 503 may include a resistor contact barrier layer 513 and a resistor contact plug 523. The resistor contact barrier layer 513 may be conformally formed on an inner wall of a resistor contact hole CHr and on the resistor electrode 330. The resistor contact barrier layer 513 may include Ti, TiN, Ta, TaN, TiW, or another barrier metal. The resistor contact plug 523 may be formed on the resistor contact barrier layer 513 to fill the resistor contact hole CHr. The resistor contact plug 523 may include a metal such as W, Cu, Ni, Co, Al, Ti, and Ta, and/or a metal compound such as a metal nitride.

Referring to FIGS. 1 and 3, a semiconductor device 10b may include a transistor area TA having a gate structure 200, a source/drain area 400, a gate contact structure 501, and a source/drain contact structure 502, and a resistor area RA having a base insulating layer 120 arranged on the substrate 100 and/or the field region 110, a resistor structure 300 arranged on the base insulating layer 120, and a resistor contact structure 503 arranged on the resistor structure 300.

A gate surface insulating layer 131 of the gate structure 200 may include oxidized silicon. For example, the gate surface insulating layer 131 may be formed by oxidizing a surface of the substrate 100.

The resistor structure 300 may include a resistor electrode 330, an inner resistor spacer 162, and an outer resistor spacer 172 directly formed on the base insulating layer 120. A surface of the base insulating layer 120 in contact with the resistor electrode 330 may be elevated. The inner resistor spacer 162 may extend onto a side of the resistor electrode 330 and a part of a surface of the base insulating layer 120. A surface of the base insulating layer 120 in contact with the inner resistor spacer 162 may be recessed to be lower than that of the base insulating layer 120 in contact with the resistor electrode 330. The resistor capping layer 182 may cover a part of the surface of the substrate 100, a side surface and a part of an upper surface of the base insulating layer 120, and a side of the resistor structure 300. For example, the resistor capping layer 182 may be in contact with the side surfaces of the inner resistor spacer 162 and the outer resistor spacer 172. An upper surface of base insulating layer 120 in contact with the resistor capping layer 182 may be recessed to be lower than that of the base insulating layer 120 in contact with the inner resistor spacer 162. Other components of FIG. 3 may be understood with further reference to FIG. 2.

The semiconductor devices 10a and 10b include a gate structure 200 and a resistor structure 300 that have different bottom levels from each other. For example, the gate structure 200 may be formed on the surface of the substrate 100, and the resistor structure 300 may be formed on the base insulating layer 120 that is formed on the surface of the substrate 100. A bottom level of the resistor structure 300 may be located at a higher level than that of the gate structure 200. The semiconductor devices 10a and 10b include a gate structure 200 and a resistor structure 300 that have the same top level. For example, an upper surface of the gate electrode 230 of the gate structure 200 and an upper surface of the resistor electrode 330 of the resistor structure 300 may be located at the same level. Accordingly, the gate electrode 230 may be thicker than the resistor electrode 330.

Because the semiconductor devices 10a and 10b include the resistor structure 300 formed at the same level as the gate structure 200, arrangement efficiency of components according to the increase in the integration may be improved. Because the semiconductor devices 10a and 10b include the resistor structure 300 having the same top level as the gate structure 200, the manufacturing process may be simplified. For example, the process of forming the contact structures 501 and 503 may be simplified and stabilized. Because the semiconductor devices 10a and 10b include the resistor structure 300 arranged on the base insulating layer 120, the resistor structure 300 may be sufficiently spaced apart from the substrate 100, and thereby the electrical operation of the components may be improved/stabilized. Because the semiconductor devices 10a and 10b include a resistor electrode 330 having a metal, a metal silicide, and a metal compound, the resistor may be sophisticated and of proper resistance.

Figure 4A:
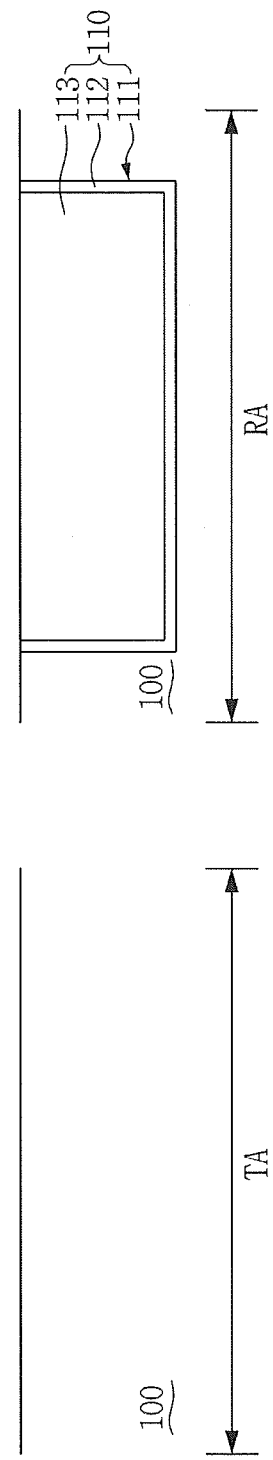
Figure 4B:
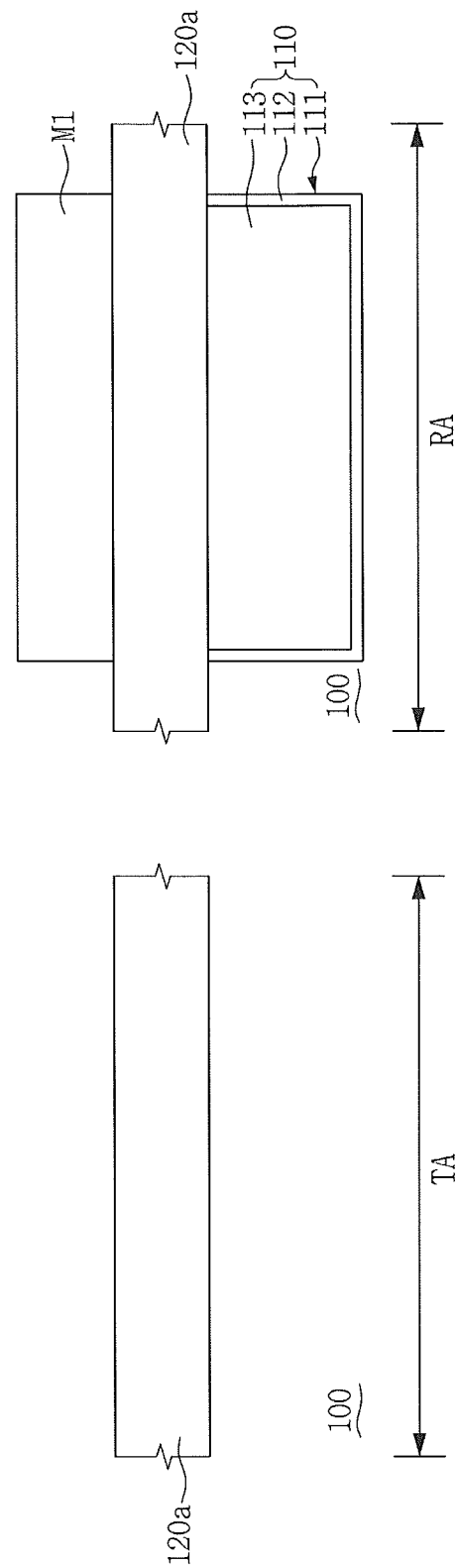
Figure 4C:
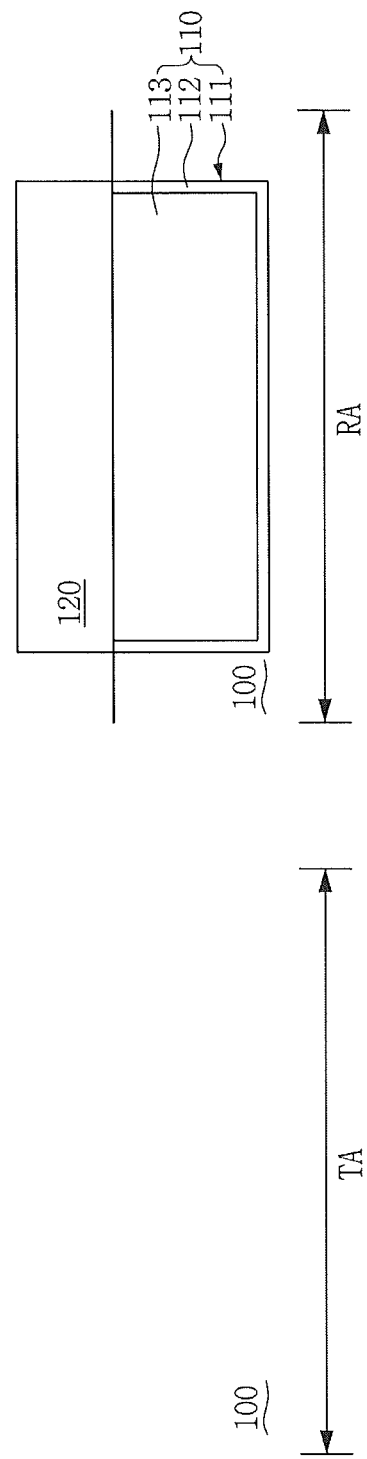
Figure 4D:
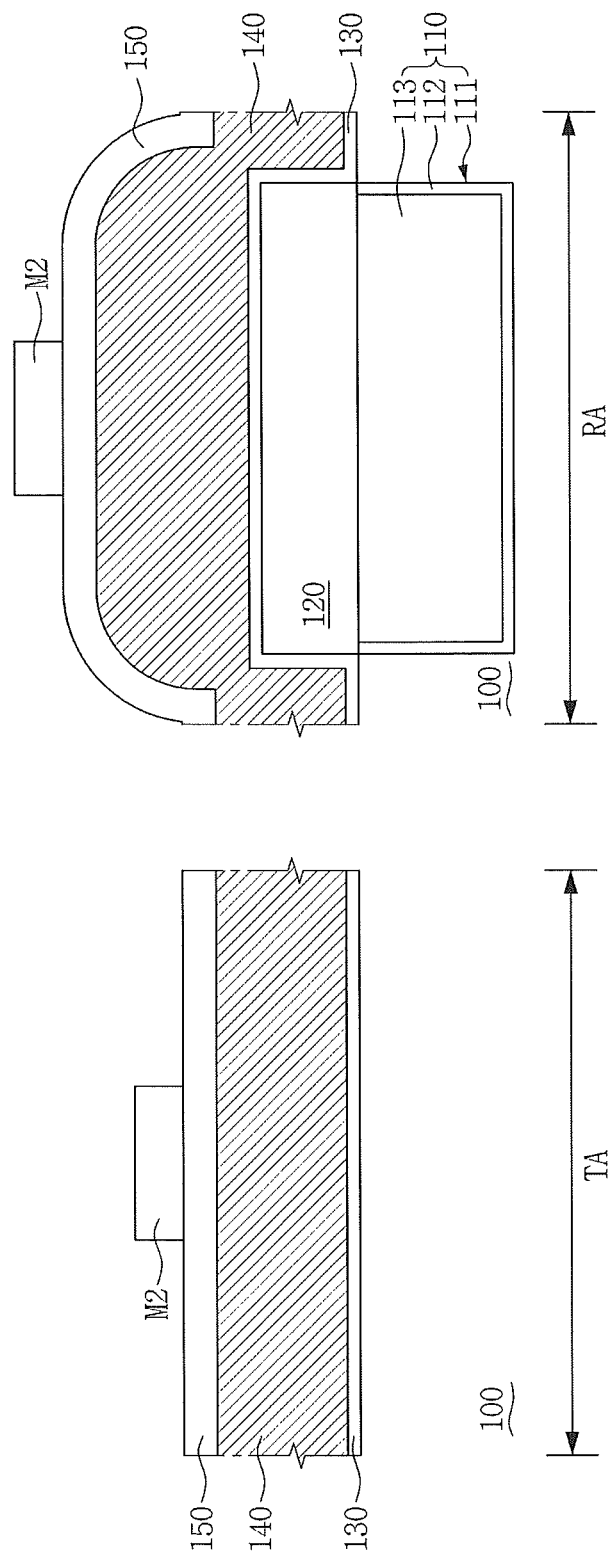
Figure 4F:
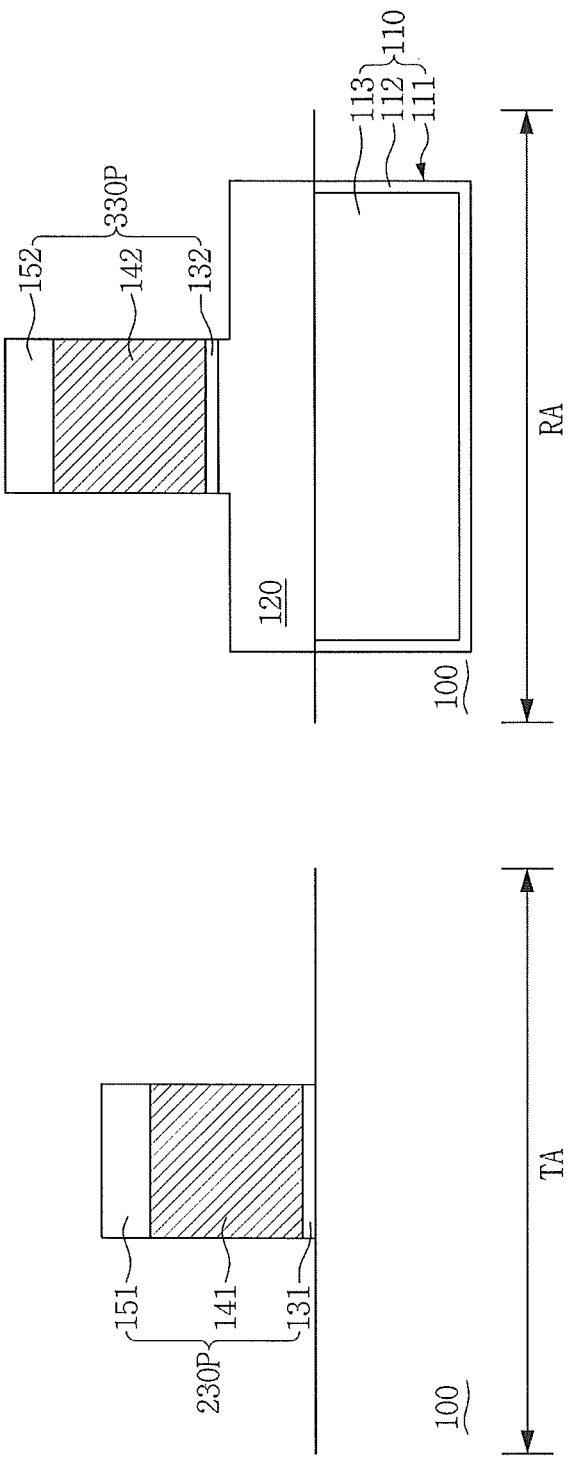
Figure 4H:
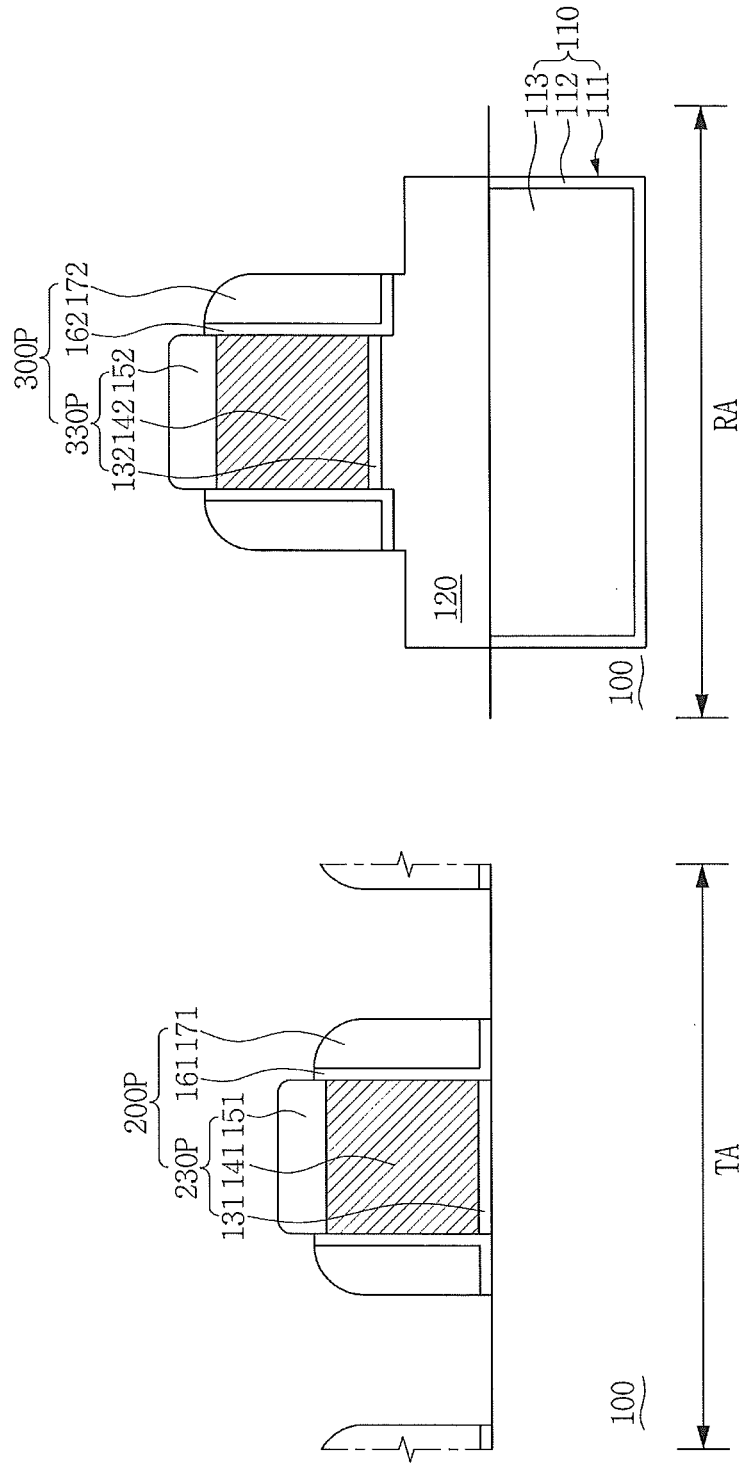
Figure 4I:
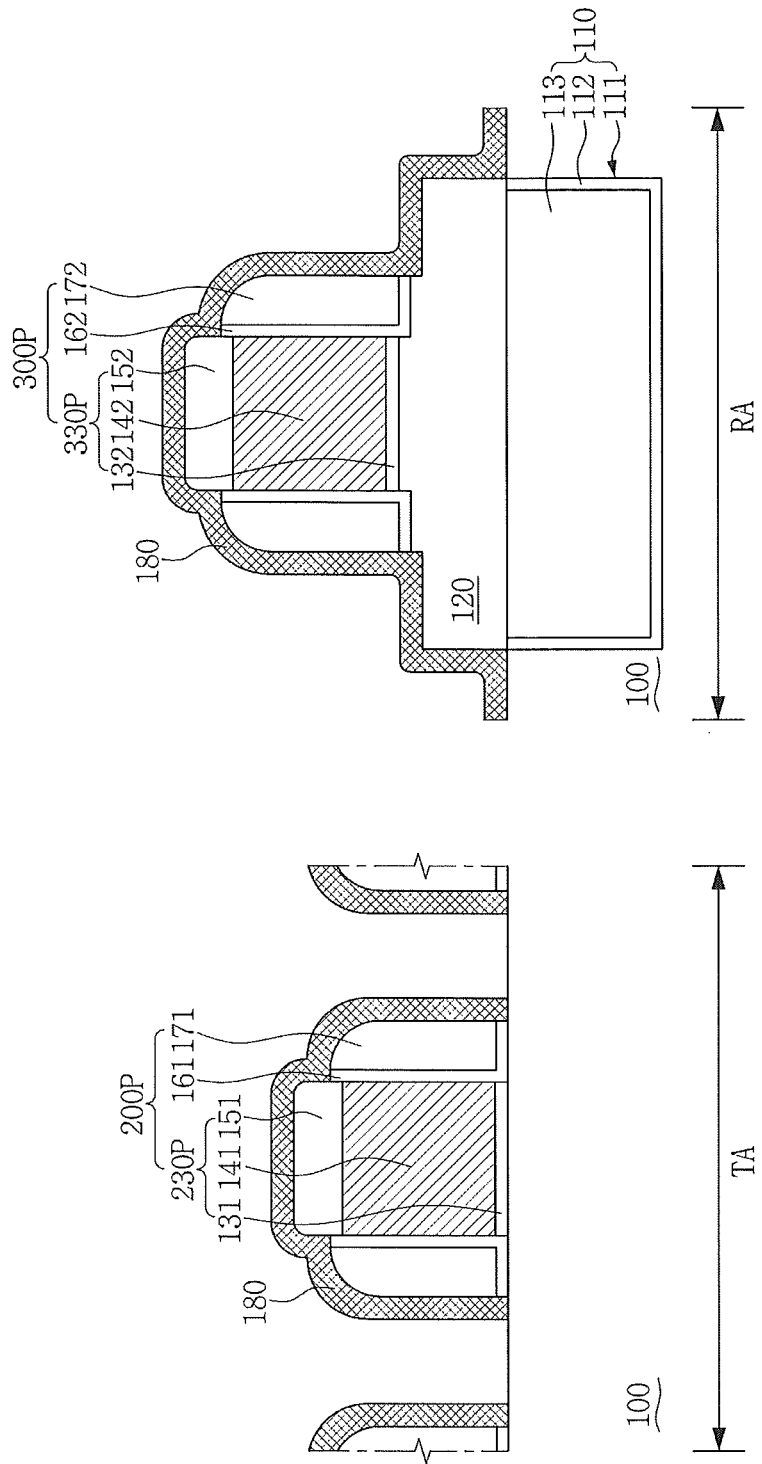
Figure 4J:
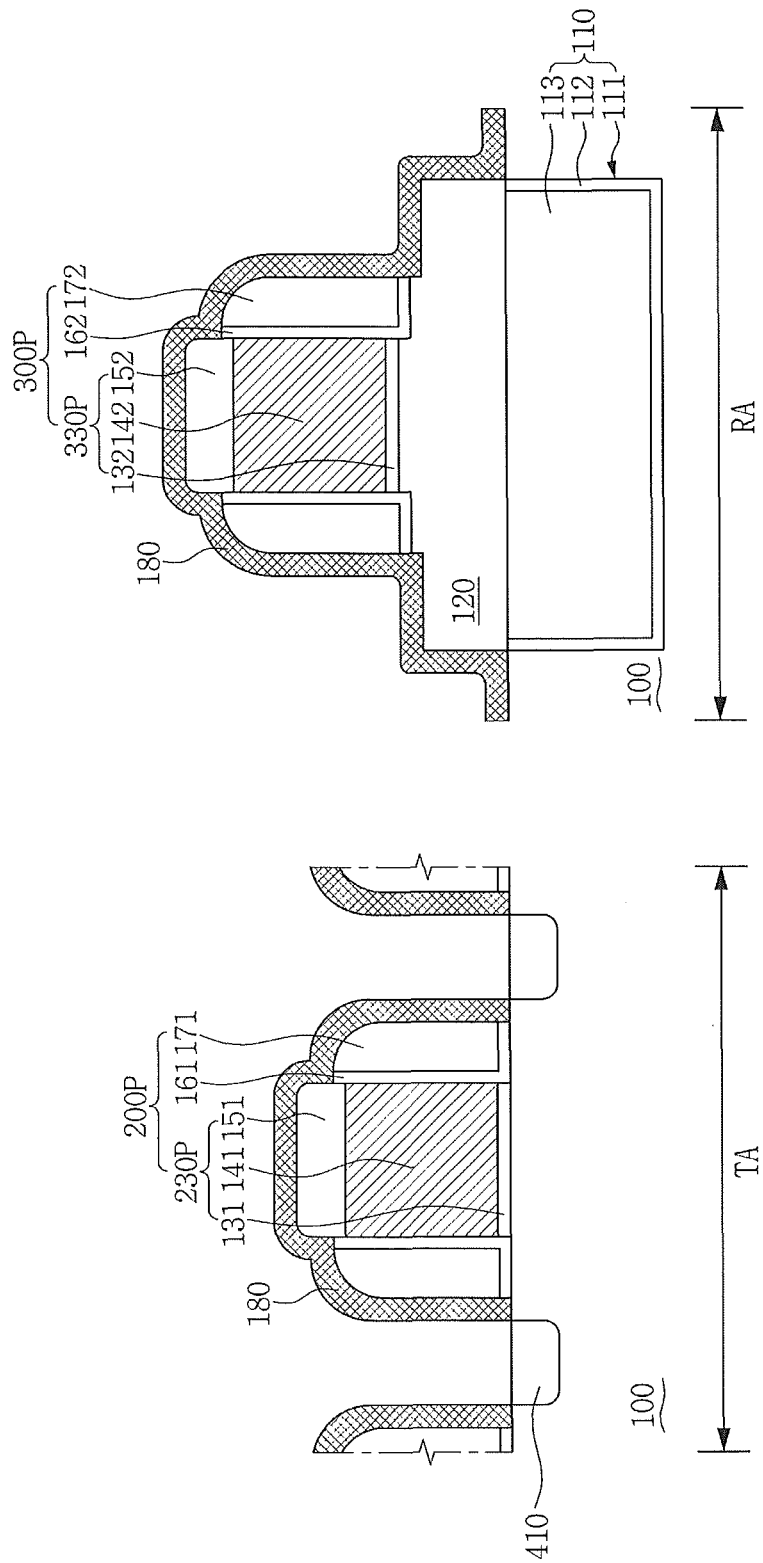
Figure 4K:
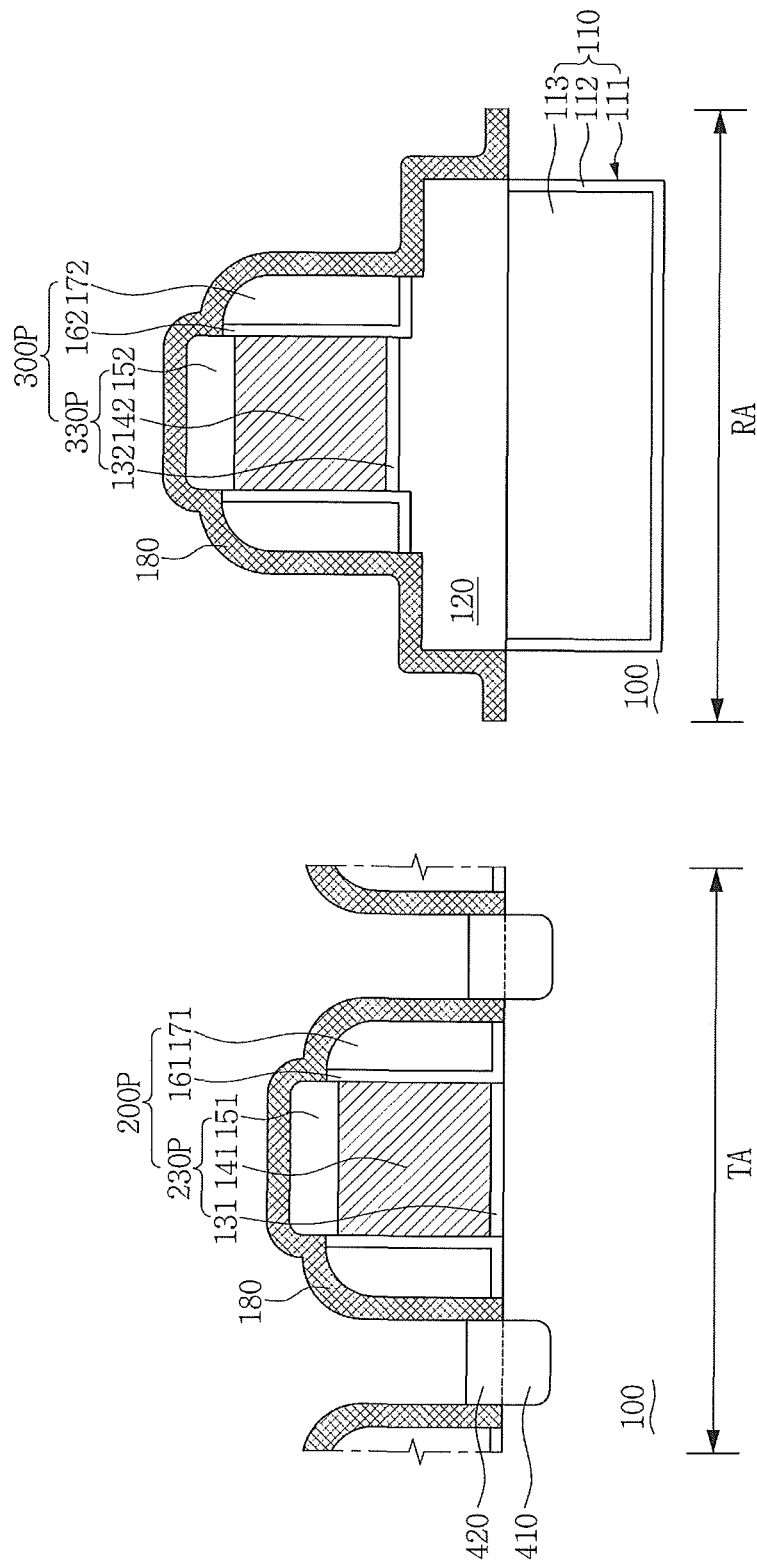
Figure 4Q:
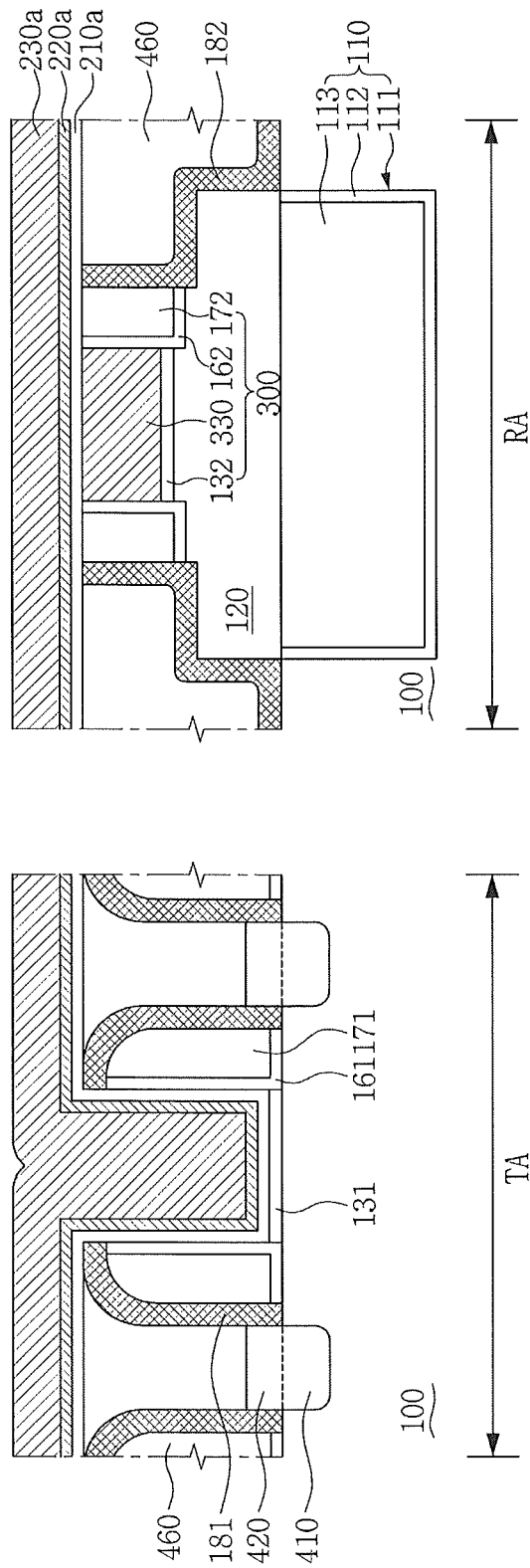
Figure 4S:
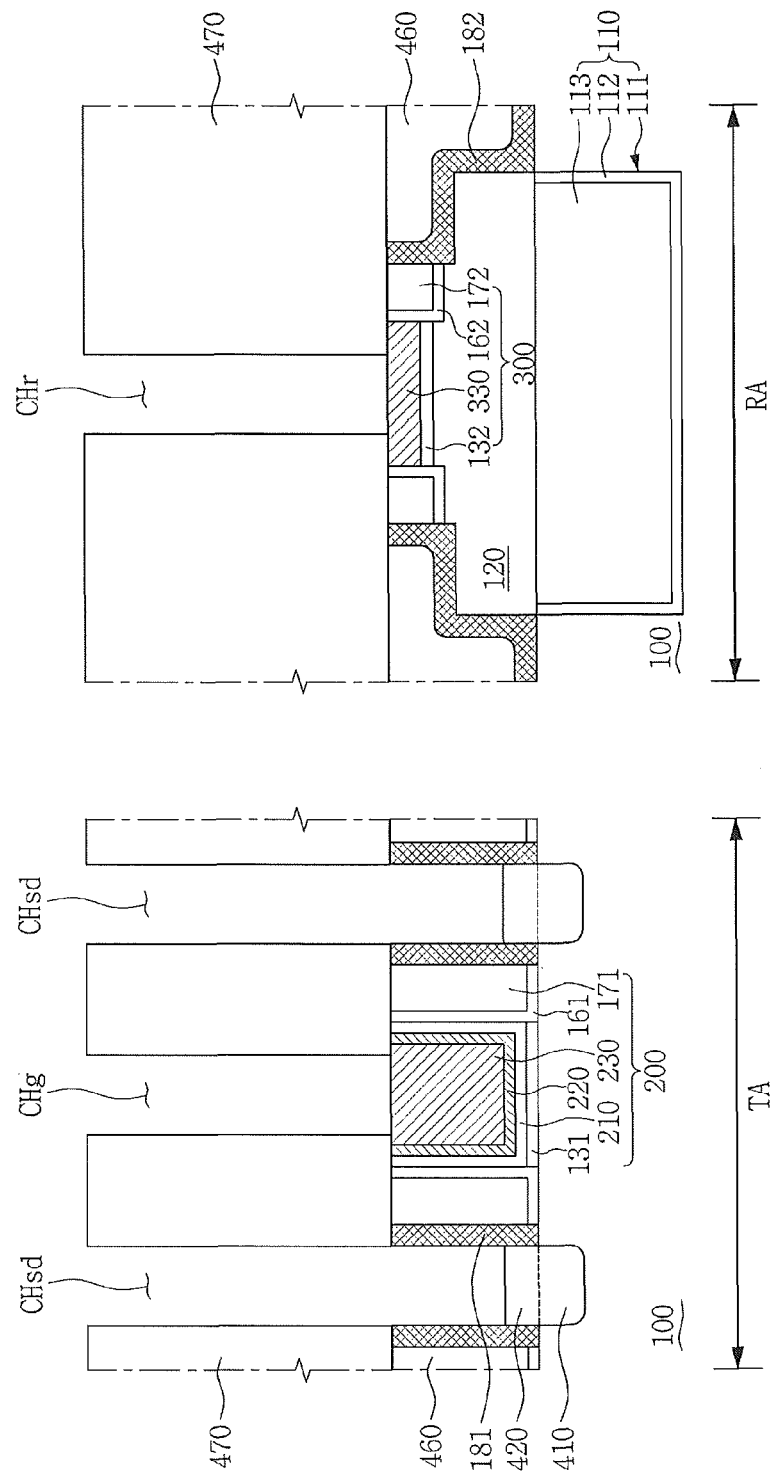
Figure 4T:
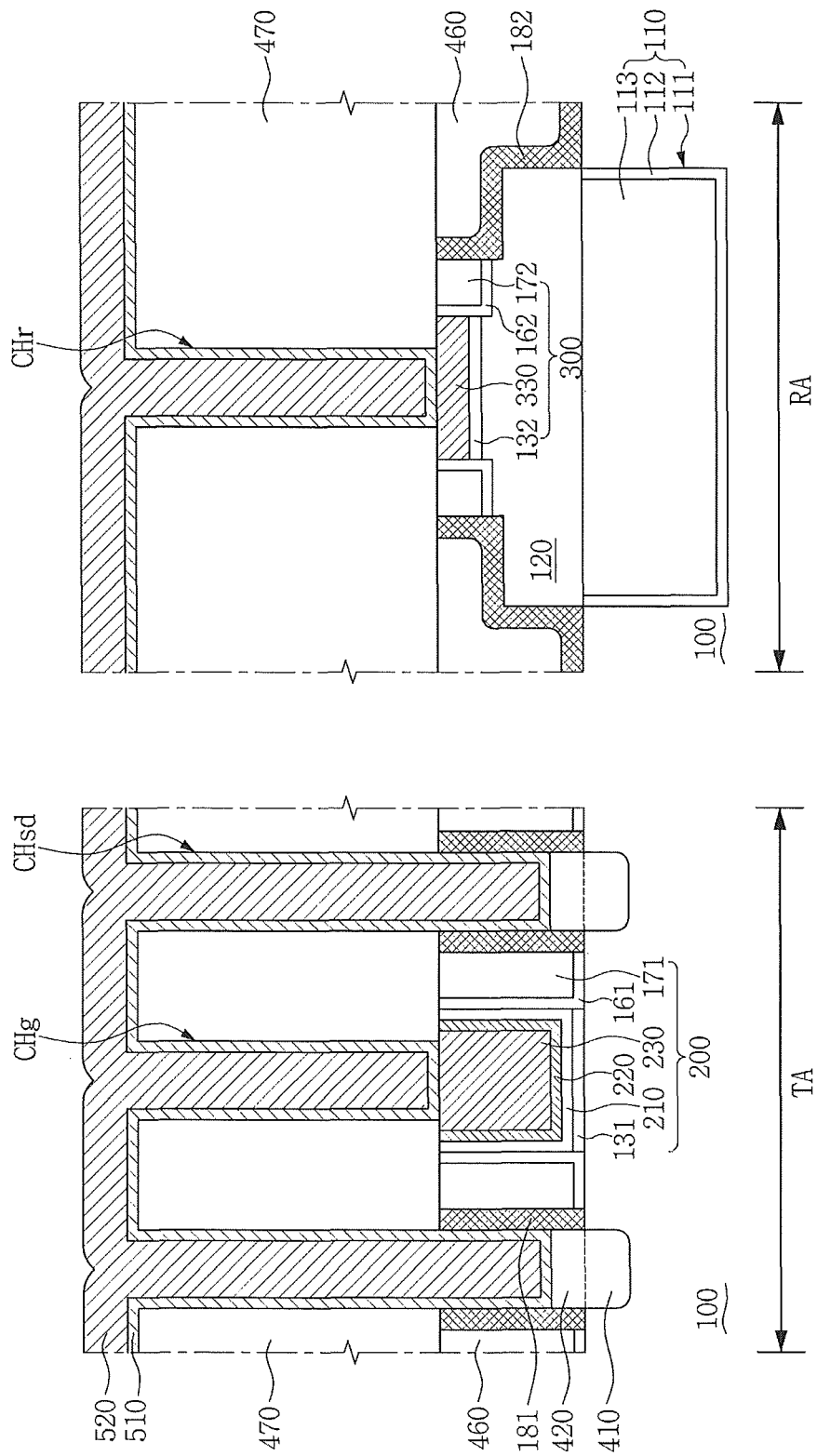

FIGS. 4A to 4T are schematic cross-sectional views taken along lines I-I' and II-II' of FIG. 1 for describing a method of forming a semiconductor device in accordance with some embodiments. Referring to FIG. 4A, a method of forming a semiconductor device may include forming a field region 110 in a substrate 100. The substrate 100 may include bulk silicon or SOI substrate. Forming the field region 110 may include forming a field trench 111 in the substrate 100, forming a field liner 112 in the field trench 111, filling the field trench 111 with a field insulating material 113, and performing a planarization process such as chemical mechanical polishing (CMP) such that a surface of the substrate 100 is the same as or similar to that of the field region 110. The field liner 112 may include silicon oxide, silicon nitride, or a combination thereof. The field insulating material 113 may include silicon oxide such as Undoped Silicate Glass (USG) or Tonen Silazene (TOSZ).

Referring to FIG. 4B, the method of forming a semiconductor device may include forming a base insulating material layer 120a on the substrate 100 and the field region 110, and forming a first etch mask pattern M1 on the base insulating material layer 120a. Forming the base insulating material layer 120a may include forming silicon oxide by performing a deposition process. The forming the first etch mask pattern M1 may include forming a photoresist pattern by performing a photolithography process. Otherwise, the first etch mask pattern M1 may include an inorganic material such as silicon nitride or polysilicon.

Referring to FIG. 4C, the method of forming a semiconductor device may include forming a base insulating layer 120 by etching the base insulating material layer 120a using the first etch mask pattern M1 as an etch mask. The etching of the base insulating material layer 120a may include performing a dry etch process using a gas including Carbon (C) and Fluorine (F) such as $CF_4$, $C_2F_6$, $C_3F_6$, and $C_4F_8$, and/or a gas including C, Hydrogen (H), and F such as $CHF_3$, or performing a wet etch process using hydrogen fluorine acid (HF). As an example, although it is described that the horizontal width of the field region 110 is the same as that of the base insulating layer 120, the horizontal width of the field region 110 may be wider, or the horizontal width of the base insulating layer 120 may be wider. Next, the first etch mask pattern M1 may be removed.

Referring to FIG. 4D, the method of forming a semiconductor device may include conformally forming a surface insulating material layer 130 on the surfaces of the substrate 100 and the base insulating layer 120, forming a sacrificial layer 140 on the surface insulating material layer 130, forming a hard mask layer 150 on the sacrificial layer 140, and forming a second etch mask pattern M2 on the hard mask layer 150. Forming the surface insulating material layer 130 may include forming silicon oxide on the surfaces of the substrate 100 and the base insulating layer 120 by performing a deposition process such as an atomic layer deposition (ALD) process or a molecular layer deposition (MLD) process. Forming the sacrificial layer 140 may include forming polysilicon by performing a deposition process such as a low pressure CVD (LP-CVD) process. Forming the hard mask layer 150 may include forming silicon nitride by performing a CVD process, etc. Forming the second etch mask pattern M2 may include forming a photoresist pattern by performing a photolithography process.

Referring to FIG. 4E, the method of forming a semiconductor device may include forming a gate hard mask pattern 151 and a resistor hard mask pattern 152 by etching the hard mask layer 150 using the second etch mask pattern M2 as an etch mask. Next, the second etch mask pattern M2 may be removed.

Referring to FIG. 4F, the method of forming a semiconductor device may include forming a preliminary gate electrode 230P, which includes a gate surface insulating layer 131, a gate sacrificial pattern 141, and a gate hard mask pattern 151; and a preliminary resistor electrode 330P, which includes a resistor surface insulating layer 132, a resistor sacrificial pattern 142, and a resistor hard mask pattern 152. Forming the preliminary gate electrode 230P and the preliminary resistor electrode 330P may include etching the sacrificial layer 140 and the surface insulating material layer 130 using the hard mask patterns 151 and 152 as etch masks. In this process, the hard mask patterns 151 and 152 may become thin.

Referring to FIG. 4G, the method of forming a semiconductor device may include forming an inner spacer material layer 160 and an outer spacer material layer 170 on the preliminary gate electrode 230P and the preliminary resistor electrode 330P. Forming the inner spacer material layer 160 may include conformally forming silicon oxide on the surfaces of the preliminary gate electrode 230P and the preliminary resistor electrode 330P, and the surface of the substrate 100 by performing a deposition process. Forming the outer spacer material layer 170 may include conformally forming silicon nitride on the inner spacer material layer 160 by performing a deposition process.

Referring to FIG. 4H, the method of forming a semiconductor device may include forming a preliminary gate structure 200P having a preliminary gate electrode 230P, an inner gate spacer 161, and an outer gate spacer 171, and a preliminary resistor structure 300P having a preliminary resistor electrode 330P, an inner resistor spacer 162, and an outer resistor spacer 172 by blanket-etching the inner spacer material layer 160 and the outer spacer material layer 170 using an etchback process. In this process, portions of the base insulating layer 120 that the preliminary resistor structure 300P does not occupy may become thin.

Referring to FIG. 4I, the method of forming a semiconductor device may include forming a capping material layer 180 covering the preliminary gate structure 200P and the preliminary resistor structure 300P. Surfaces of the substrate 100 located at both sides of the preliminary gate structure 200P may not be covered by the capping material layer 180 and may be exposed. Forming the capping material layer 180 may include conformally forming silicon oxide by performing a deposition process, such as an ALD process. A part of the capping material layer 180 may be removed by a photolithography process.

Referring to FIG. 4J, the method of forming a semiconductor device may include forming a lower source/drain area 410 by injecting impurity atoms into the exposed substrate 100. The injection of the impurity atoms may include injecting group III or group V atoms in the periodic table, such as P, As, or B, into the substrate 100 by performing an ion implantation process or an ion diffusion process.

Referring to FIG. 4K, the method of forming a semiconductor device may include forming an upper source/drain area 420 on the lower source/drain area 410 by performing a selective epitaxial growth process. For example, the upper source/drain area 420 may include epitaxially-grown single crystalline silicon. The upper source/drain area 420 may include a silicide. For example, forming the upper source/drain area 420 may further include forming a metal such as Ni, Co, and Ti on the epitaxially-grown single crystalline silicon, and performing a silicidation process. In this process, the upper source/drain area 420, in whole or in part, may be changed to a silicide material. The silicide material may include NiSi, CoSi, WSi, or TiSi.

Referring to FIG. 4L, the method of forming a semiconductor device may include forming a lower interlayer insulating layer 460 covering the preliminary gate structure 200P, the upper source/drain area 420, the preliminary resistor structure 300P, and the capping material layer 180, and performing a CMP process to expose the resistor hard mask pattern 152 of the preliminary resistor structure 300P. Forming the lower interlayer insulating layer 460 may include forming silicon oxide by performing a deposition process or a coating process.

Referring to FIG. 4M, the method of forming a semiconductor device may include forming a resistor electrode space SR by removing the resistor hard mask pattern 152 and the resistor sacrificial pattern 142 of the preliminary resistor structure 300P. The resistor electrode space SR may be defined by the resistor surface insulating layer 132 and the inner resistor spacer 162. In some embodiments, the resistor surface insulating layer 132 and the inner resistor spacer 162 that are exposed in the resistor electrode space SR, in part or in whole, may be removed. In this case, the resistor electrode space SR may be defined by the base insulating layer 120 and the outer resistor spacer 172. The removal of the resistor hard mask pattern 152 may include performing a dry etch process using a gas including C and F such as $CF_4$, $C_2F_6$, $C_3F_6$, and $C_4F_8$, and/or a gas including C, H, and F such as $CHF_3$, or a wet etch process using phosphoric acid ($H_3PO_4$). The removal of the resistor sacrificial pattern 142 may include performing a dry etch process using chloride ion (Cl−) or chloride radical (Cl*).

Referring to FIG. 4N, the method of forming a semiconductor device may include forming a resistor electrode material layer 330a to fill the resistor electrode space SR. Forming the resistor electrode material layer 330a may include forming a metal, a metal silicide, or a metal compound by performing a deposition process. For example, the resistor electrode material layer 330a may include a metal such as W, Cu, Ni, Co, Al, Ti, and Ta, a metal silicide such as NiSi, CoSi, WSi, and TiSi, or a metal compound such as WN, TiN, and TaN.

Referring to FIG. 4O, the method of forming a semiconductor device may include performing a CMP process to expose the gate hard mask pattern 151 of the preliminary gate structure 200P. In this process, a resistor structure 300 may be formed on the base insulating layer 120. The resistor structure 300 may include a resistor surface insulating layer 132, a resistor electrode 330, a lowered inner resistor spacer 162, and a lowered outer resistor spacer 172. The resistor structure 300 may further include a resistor capping layer 182. Sides of the preliminary gate structure 200P may be covered by the gate capping layer 181.

Referring to FIG. 4P, the method of forming a semiconductor device may include forming a gate electrode space SG by removing the gate hard mask pattern 151 and the gate sacrificial pattern 141 of the preliminary gate structure 200P. The gate electrode space SG may be defined by the gate surface insulating layer 131 and the inner gate spacer 161. The removal of the gate hard mask pattern 151 may include performing a dry etch process using a gas including C and F such as $CF_4$, $C_2F_6$, $C_3F_6$, and $C_4F_8$, and/or a gas including C, H, and F such as $CHF_3$, or a wet etch process using $H_3PO_4$. The removal of the gate sacrificial pattern 141 may include performing a dry etch process using chloride ion (Cl−) or chloride radical (Cl*).

Referring to FIG. 4Q, the method of forming a semiconductor device may include forming a gate insulating material layer 210a, a gate barrier material layer 220a, and a gate electrode material layer 230a in the gate electrode space SG. Forming the gate insulating material layer 210a may include conformally forming a metal oxide such as HfO, LaO, and AlO by performing a deposition process. Forming the gate barrier material layer 220a may include forming Ti, TiN, Ta, TaN, TiW, or another barrier metal by performing a deposition process. Forming the gate electrode material layer 230a may include forming a metal such as W, Cu, Ni, Co, Al, Ti, and Ta, and/or a metal compound such as a metal nitride to fill the gate electrode space SG, by performing a deposition process.

Referring to FIG. 4R, the method of forming a semiconductor device may include forming a gate structure 200 by performing a CMP process. The gate structure 200 may include a gate surface insulating layer 131, a gate insulating layer 210, a gate barrier layer 220, a gate electrode 230, an inner gate spacer 161, an outer gate spacer 171, and/or a gate capping layer 181. In this process, the resistor structure 300 may become thinner. A top level of the gate structure 200 may be the same as that of the resistor structure 300.

Referring to FIG. 4S, the method of forming a semiconductor device may include forming an upper interlayer insulating layer 470 covering the lower interlayer insulating layer 460, the gate structure 200, and the resistor structure 300, and forming contact holes CHg, CHsd, and CHr vertically passing through the upper interlayer insulating layer 470 and/or the lower interlayer insulating layer 460 to expose the gate electrode 230, the upper source/drain area 420, and the resistor electrode 330. Forming the upper interlayer insulating layer 470 may include forming silicon oxide by performing a deposition process or a coating process. The gate contact hole CHg may expose the gate electrode 230, the source/drain contact hole CHsd may expose the upper source/drain area 420, and the resistor contact hole CHr may expose the resistor electrode 330. Forming the contact holes CHg, CHsd, and CHr may include performing a photolithography process. In this process, a surface of the upper source/drain area 420 may be lowered.

Referring to FIG. 4T, the method of forming a semiconductor device may include conformally forming a contact barrier material layer 510 in the contact holes CHg, CHsd, and CHr, and forming a contact plug material layer 520 on the contact barrier material layer 510 to fill the contact holes CHg, CHsd, and CHr. Forming the contact barrier material layer 510 may include forming Ti, TiN, Ta, TaN, TiW, or another barrier metal on inner walls and bottoms of the contact holes CHg, CHsd, and CHr using a deposition process such as CVD or sputtering. Forming the contact plug material layer 520 may include forming a metal such as W, Cu, Ni, Co, Al, Ti, and Ta, and/or a metal compound such as a metal nitride.

Next, referring again to FIG. 2, the method of forming a semiconductor device may include forming contact structures 501, 502, and 503 by performing a CMP process. The contact structures 501, 502, and 503 may include contact barrier layers 511, 512, and 513 conformally formed on inner walls and bottoms of the contact holes CHg, CHsd, and CHr, and contact plugs 521, 522, and 523 filling the contact holes CHg, CHsd, and CHr.

FIGS. 5A and 5B are schematic cross-sectional views taken along lines I-I' and II-II' of FIG. 1 for describing a method of forming a semiconductor in accordance with some embodiments. Referring to FIG. 5A, the method of forming a semiconductor device may include forming a gate electrode space SG exposing the surface of the substrate 100 by removing the gate hard mask pattern 151, the gate sacrificial pattern 141, and the gate surface insulating layer 131 of the preliminary gate structure 200P, after performing the processes with reference to FIGS. 4A to 4O and descriptions thereof. The removal of the gate surface insulating layer 131 may include performing a dry etch process using a gas including C and F such as $CF_4$, $C_2F_6$, $C_3F_6$, and $C_4F_8$, and/or a gas including C, H, and F such as $CHF_3$, or a wet etch process using HF. In some embodiments, the inner gate spacer 161 in the gate electrode space SG may also be removed. Moreover, in some embodiments, parts of the lower interlayer insulating layer 460 and/or the gate capping layer 181 may be removed during the process of removing the gate surface insulating layer 131.

Referring to FIG. 5B, the method of forming a semiconductor device may include forming an oxidized gate surface insulating layer 131a on the exposed surface of the substrate 100 in the gate electrode space SG. Forming the oxidized gate surface insulating layer 131a may include oxidizing the surface of the substrate 100 exposed in the gate electrode space SG by performing an oxidation process. In other drawings, the oxidized gate surface insulating layer 131a may be described as the same elements as the gate surface insulating layer 131. Next, the method of forming a semiconductor device may include performing the processes with reference to FIGS. 4O to 4T, and FIG. 2.

Figure 6A:
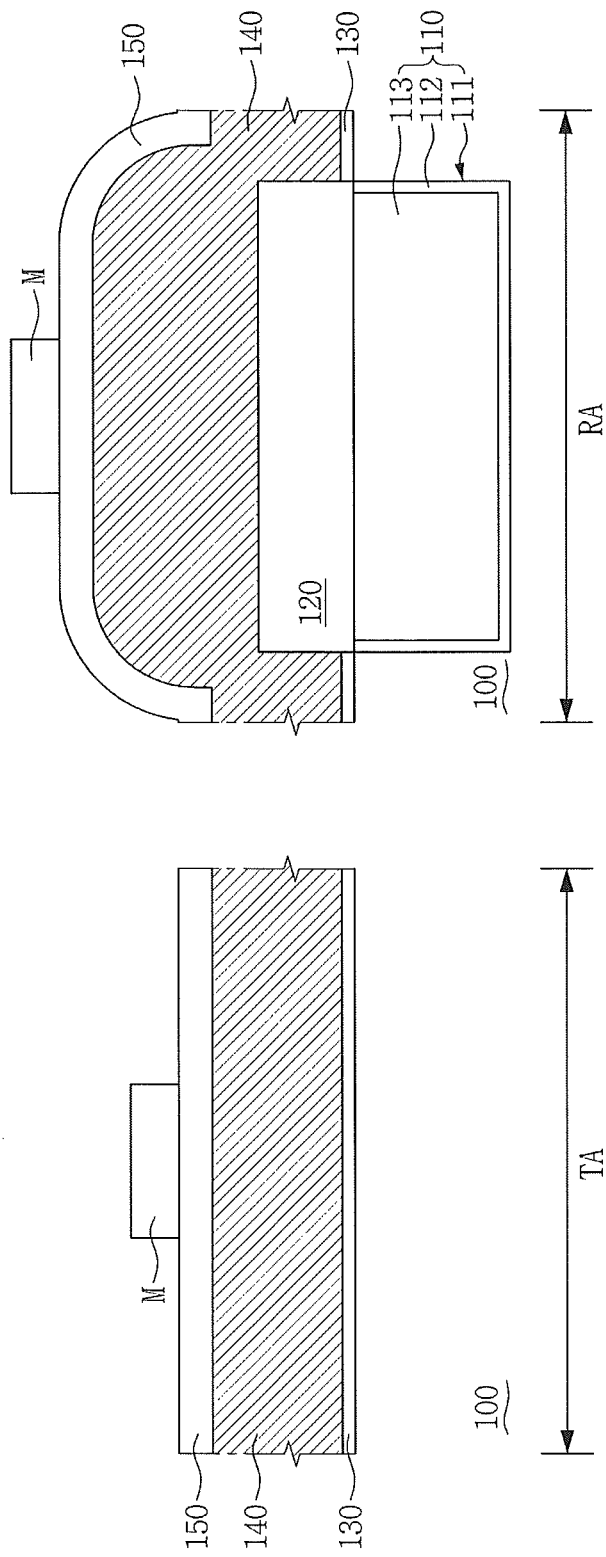

FIGS. 6A to 6K are schematic cross-sectional views taken along lines I-I' and II-II' of FIG. 1 for describing a method of forming a semiconductor in accordance with an embodiment of the inventive concept. Referring to FIG. 6A, the method of forming a semiconductor device, with further reference to FIGS. 4A to 4D, may include forming a field region 110 in a substrate 100, forming a base insulating layer 120, forming a surface insulating material layer 130 on a surface of the substrate 100 by performing an oxidation process, forming a sacrificial layer 140 on the surface insulating material layer 130, forming a hard mask layer 150 on the sacrificial layer 140, and forming an etch mask pattern M on the hard mask layer 150. The surface insulating material layer 130 may be formed only on the surface of the substrate 100. For example, forming the surface insulating material layer 130 may include oxidizing the surface of the substrate 100.

Referring to FIG. 6B, the method of forming a semiconductor device, with further reference to FIGS. 4E to 4F, may include forming a preliminary gate electrode 230P having a gate surface insulating layer 131, a gate sacrificial pattern 141, and a gate hard mask pattern 151, and a preliminary resistor electrode 330P having a resistor sacrificial pattern 142 and a resistor hard mask pattern 152. Portions of the base insulating layer 120 that the preliminary resistor electrode 330P does not occupy may become reduced/low.

Figure 6C:
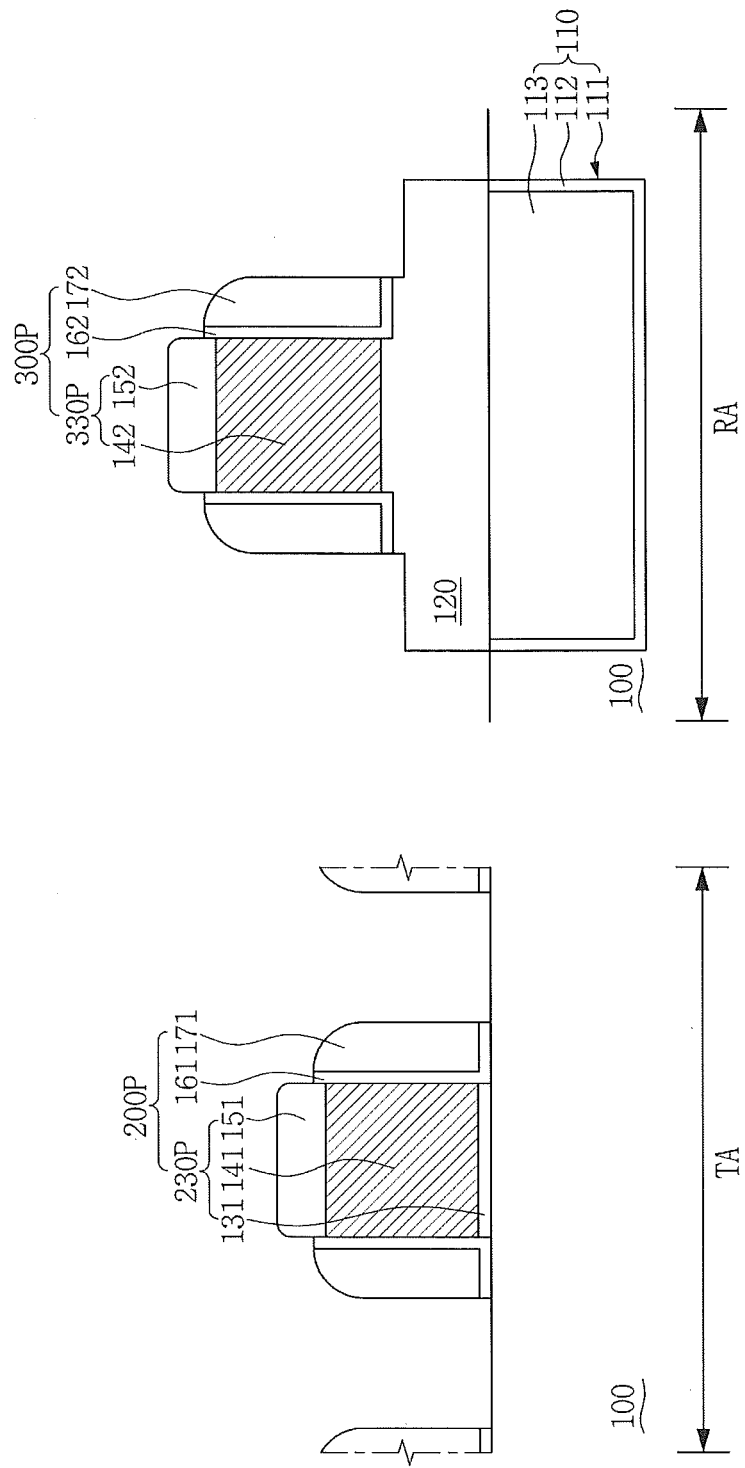

Referring to FIG. 6C, the method of forming a semiconductor device, with further reference to FIGS. 4G to 4H, may include forming a preliminary gate structure 200P by forming an inner gate spacer 161 and an outer gate spacer 171 on a side of the preliminary gate electrode 230P, and forming a preliminary resistor structure 300P by forming an inner resistor spacer 162 and an outer resistor spacer 172 on a side of the preliminary resistor electrode 330P. In this process, portions of the base insulating layer 120 that the preliminary resistor structure 300P does not occupy may become lower.

Referring to FIG. 6D, the method of forming a semiconductor device, with further reference to FIGS. 4I to 4L, may include forming a gate capping layer 181 and a resistor capping layer 182, forming a lower source/drain area 410 and an upper source/drain area 420, forming a lower interlayer insulating layer 460, and performing a CMP process to expose the resistor hard mask pattern 152 of the preliminary resistor structure 300P.

Referring to FIG. 6E, the method of forming a semiconductor device, with further reference to FIGS. 4M and 4N, may include removing the resistor hard mask pattern 152 and the resistor sacrificial pattern 142, and forming a resistor electrode material layer 330a.

Referring to FIG. 6F, the method of forming a semiconductor device, with further reference to FIG. 4O, may include performing a CMP process to expose the gate hard mask pattern 151 of the preliminary gate structure 200P. In this process, a resistor structure 300 including a resistor electrode 330, an inner resistor spacer 162, and an outer resistor spacer 172 may be formed.

Referring to FIG. 6G, the method of forming a semiconductor device, with further reference to FIG. 4P, may include forming a gate electrode space SG by removing the gate hard mask pattern 151 and the gate sacrificial pattern 141 of the preliminary gate structure 200P. Referring to FIG. 6H, the method of forming a semiconductor device, with further reference to FIG. 4Q, may include forming a gate insulating material layer 210a, a gate barrier material layer 220a, and a gate electrode material layer 230a in the gate electrode space SG.

Figure 6I:
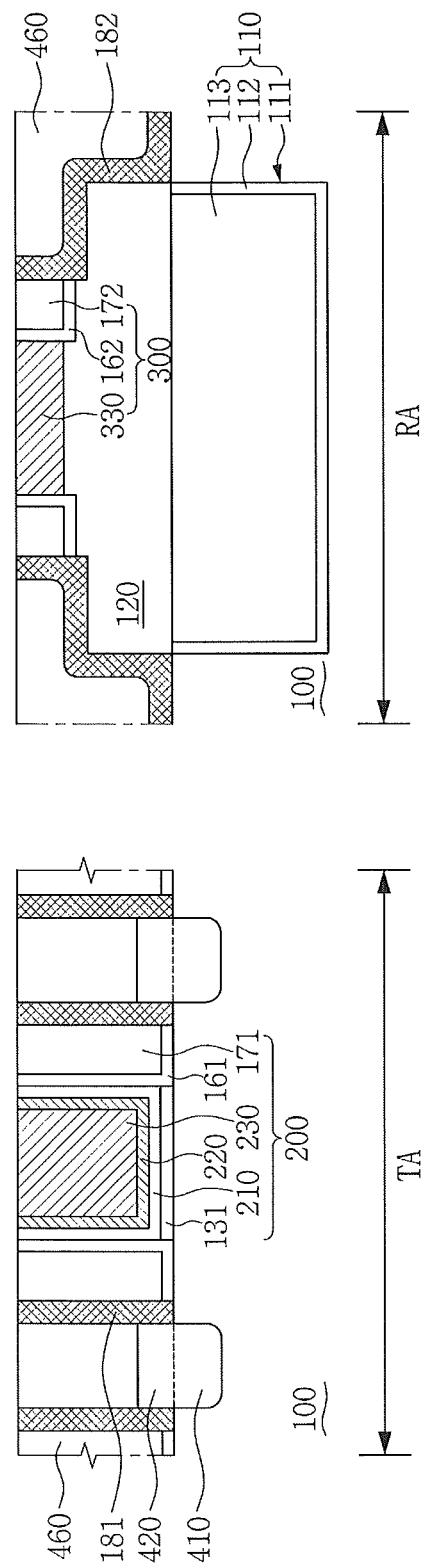

Referring to FIG. 6I, the method of forming a semiconductor device, with further reference to FIG. 4R, may include forming a gate structure 200 having a gate surface insulating layer 131, a gate insulating layer 210, a gate barrier layer 220, a gate electrode 230, an inner gate spacer 161, and an outer gate spacer 171, by performing a CMP process.

Figure 6J:
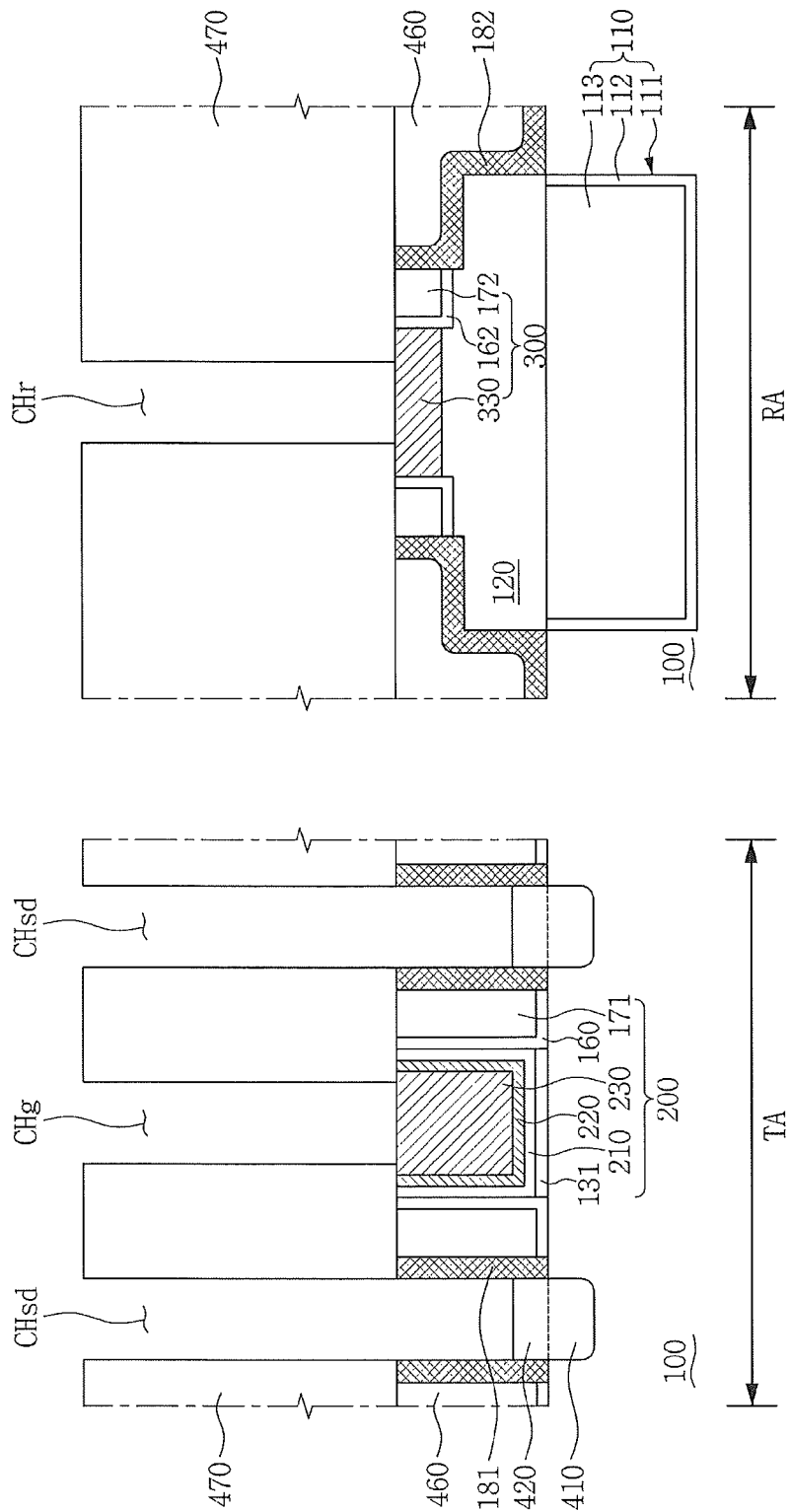

Referring to FIG. 6J, the method of forming a semiconductor device, with further reference to FIG. 4S, may include forming an upper interlayer insulating layer 470, and forming contact holes CHg, CHsd, and CHr vertically passing through the upper interlayer insulating layer 470 and the lower interlayer insulating layer 460 to expose the gate electrode 230, the upper source/drain area 420, and the resistor electrode 330.

Figure 6K:
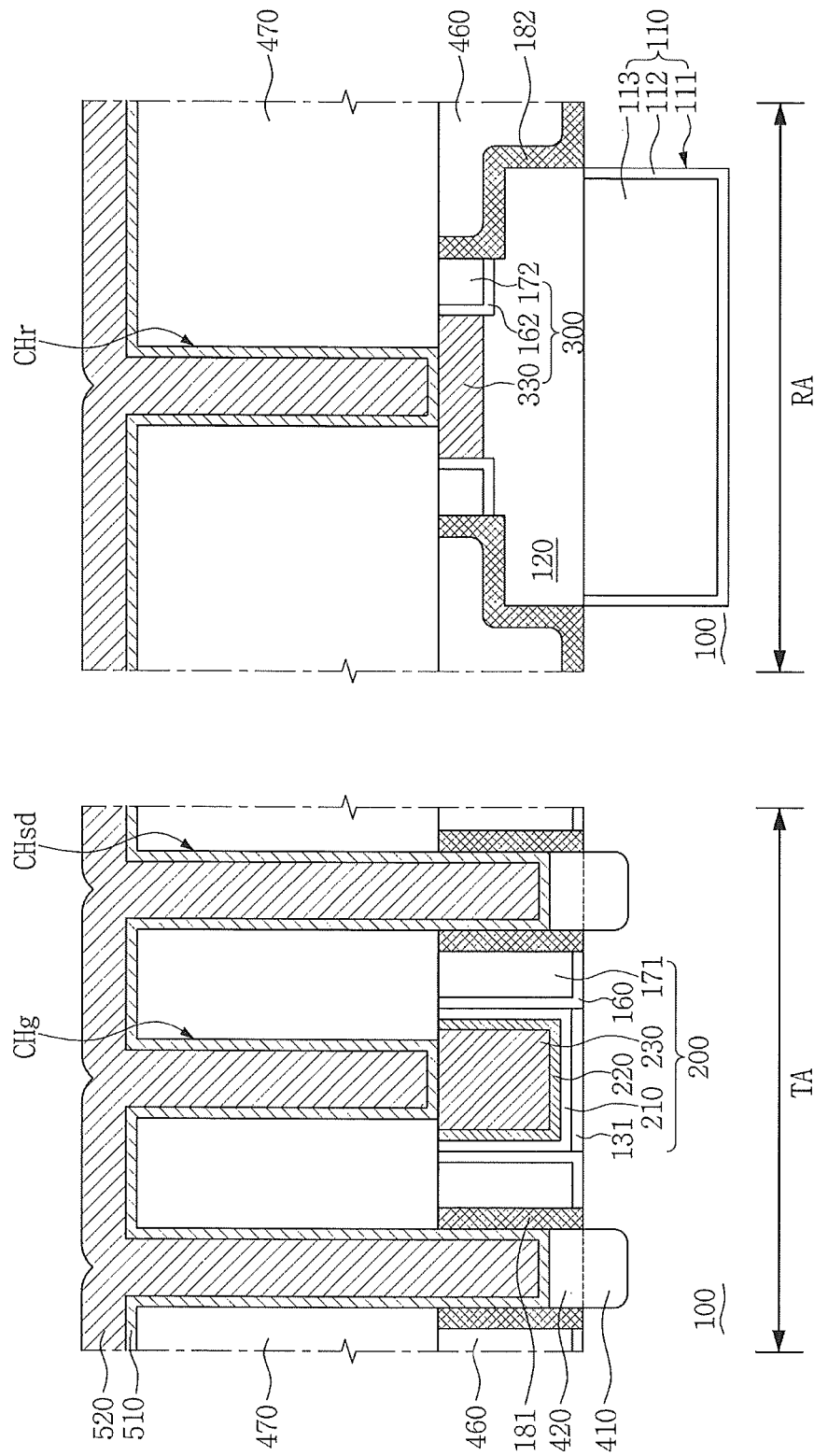

Referring to FIG. 6K, the method of forming a semiconductor device, with further reference to FIG. 4T, may include forming a contact barrier material layer 510 and a contact plug material layer 520 filling the contact holes CHg, CHsd, and CHr.

Next, with further reference to FIG. 3, the method of forming a semiconductor device may include forming contact structures 501, 502, and 503 by performing a CMP process. The contact structures 501, 502, and 503 may include contact barrier layers 511, 512, and 513 conformally formed on inner walls and bottoms of the contact holes CHg, CHsd, and CHr, and contact plugs 521, 522, and 523 filling the contact holes CHg, CHsd, and CHr.

FIGS. 7A and 7B are schematic cross-sectional views taken along lines I-I' and II-II' of FIG. 1 for describing a method of forming a semiconductor in accordance with some embodiments. Referring to FIG. 7A, the method of forming a semiconductor device, after performing the processes with reference to FIGS. 6A to 6G and the description thereof, may include forming a gate electrode space SG exposing a surface of the substrate 100 by removing the gate hard mask pattern 151, the gate sacrificial pattern 141, and the gate surface insulating layer 131 of the preliminary gate structure 200P. In some embodiments, the inner gate spacer 161 in the gate electrode space SG may be removed. Moreover, in some embodiments, parts of the lower interlayer insulating layer 460 and/or gate capping layer 181 may be removed while removing the gate surface insulating layer 131.

Referring to FIG. 7B, the method of forming a semiconductor device may include forming an oxidized gate surface insulating layer 131a on the surface of the substrate 100 exposed in the gate electrode space SG. In other drawings, the oxidized gate surface insulating layer 131a may be described as the same element as the gate surface insulating layer 131. Next, the method of forming a semiconductor device may include performing the processes with reference to FIGS. 6H to 6K, and FIG. 3.

Because the methods of forming the semiconductor devices 10a and 10b provide a method of forming the resistor structure 300 at the same level as the gate structure 200, spatial efficiency and process efficiency of the semiconductor devices 10a and 10b may be improved.

Because the resistor structure 300 is formed before the gate structure 200 in the methods of forming the semiconductor devices 10a and 10b, the thermal burden of the gate structure 200 may be reduced, and therefore performance degradation of the gate structure 200 may be reduced/prevented.

Because the methods of forming the semiconductor devices 10a and 10b provide a method of forming the resistor structure 300 compatible with the gate structure 200, the manufacturing process may be simplified. In particular, because the methods provide a method of forming the gate electrode 230 and the resistor electrode 330 using a replacement method, each of the electrode materials may be improved/optimized.

Because the methods of forming the semiconductor devices 10a and 10b provide a method of forming a gate structure 200 and a resistor structure 300 having the same top level, the subsequent process of forming the contact structures 501 and 503 may be simplified and stabilized.

Figure 8A:
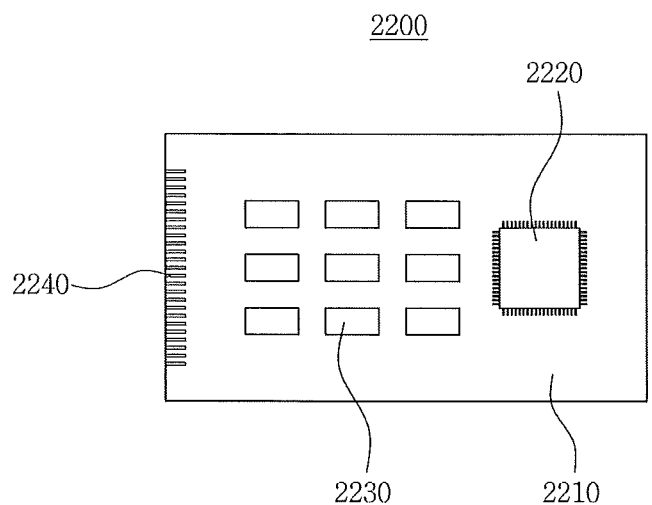
FIG. 8A is a diagram schematically illustrating a semiconductor module including at least one of the semiconductor devices in accordance with various embodiments.

FIG. 8A is a diagram schematically illustrating a semiconductor module 2200 including at least one of the semiconductor devices 10a and 10b in accordance with various embodiments described herein. Referring to FIG. 8A, the semiconductor module 2200 may be one of the semiconductor devices 10a and 10b mounted on a module substrate 2210 in accordance with various embodiments. The semiconductor module 2200 may further include a microprocessor 2220 mounted on the module substrate 2210. Input/output terminals 2240 may be arranged on at least one side of the module substrate 2210. The microprocessor 2220 may be one of the semiconductor devices 10a and 10b mounted on a module substrate 2210 in accordance with some embodiments.

Figure 8B:
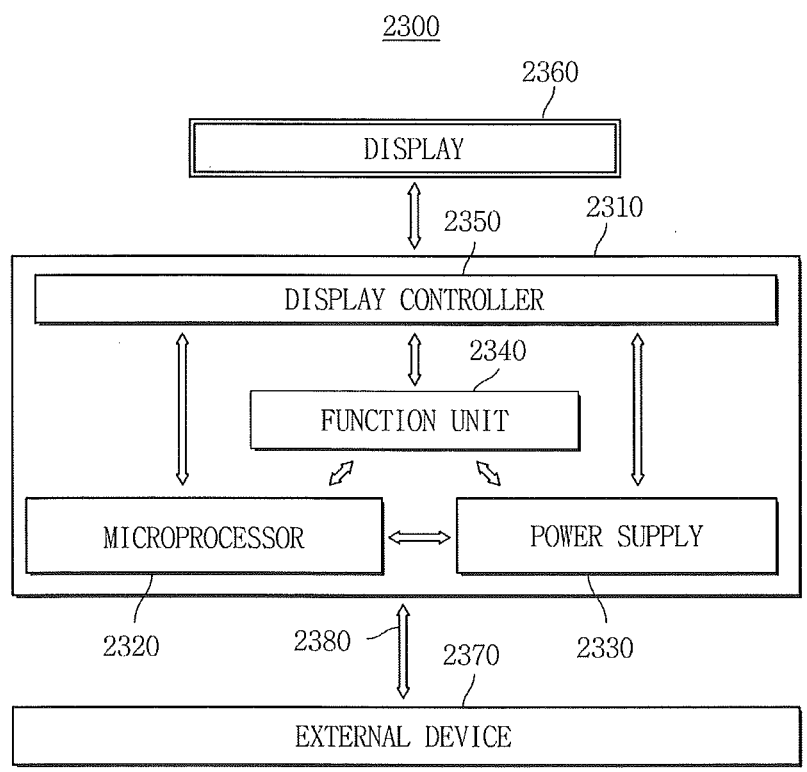
FIGS. 8B and 8C are block diagrams schematically illustrating electronic systems including at least one of the semiconductor devices in accordance with various embodiments.

FIG. 8B is a block diagram schematically illustrating an electronic system 2300 including at least one of the semiconductor devices 10a and 10b in accordance with various embodiments described herein. Referring to FIG. 8B, the semiconductor devices 10a and 10b in accordance with various embodiments may be applied to the electronic system 2300. The electronic system 2300 may include a body 2310. The body 2310 may include a microprocessor 2320, a power supply 2330, a function unit 2340, and/or a display controller 2350. The body 2310 may be a system board or motherboard including a printed circuit board (PCB). The microprocessor 2320, the power supply 2330, the function unit 2340, and the display controller 2350 may be mounted or installed on the body 2310. A display 2360 may be arranged on a top surface or outside of the body 2310. For example, the display 2360 may be arranged on a surface of the body 2310 and display an image processed by the display controller 2350. The power supply 2330 may receive a constant voltage from an external power source, etc., divide the voltage into various levels, and supply those voltages to the microprocessor 2320, the function unit 2340, and the display controller 2350, etc. The microprocessor 2320 may receive a voltage from the power supply 2330 to control the function unit 2340 and the display 2360. The function unit 2340 may perform various functions of the electronic system 2300. For example, if the electronic system 2300 is a mobile electronic apparatus such as a mobile phone, the function unit 2340 may have several components that can perform functions of wireless communication such as dialing, video output to the display 2360 through communication with an external device/apparatus 2370, and sound output to a speaker, and if a camera is installed, the function unit 2340 may function as an image processor. In some embodiments, when the electronic system 2300 is connected to a memory card, etc. to expand capacity, the function unit 2340 may be a memory card controller. The function unit 2340 may exchange signals with the external apparatus 2370 through a wired or wireless communication unit 2380. In addition, when the electronic system 2300 needs a universal serial bus (USB), etc. to expand functionality, the function unit 2340 may function as an interface controller. The semiconductor devices 10a and 10b described in various embodiments may be included in at least one of the microprocessor 2320 and the function unit 2340.

Figure 8C:
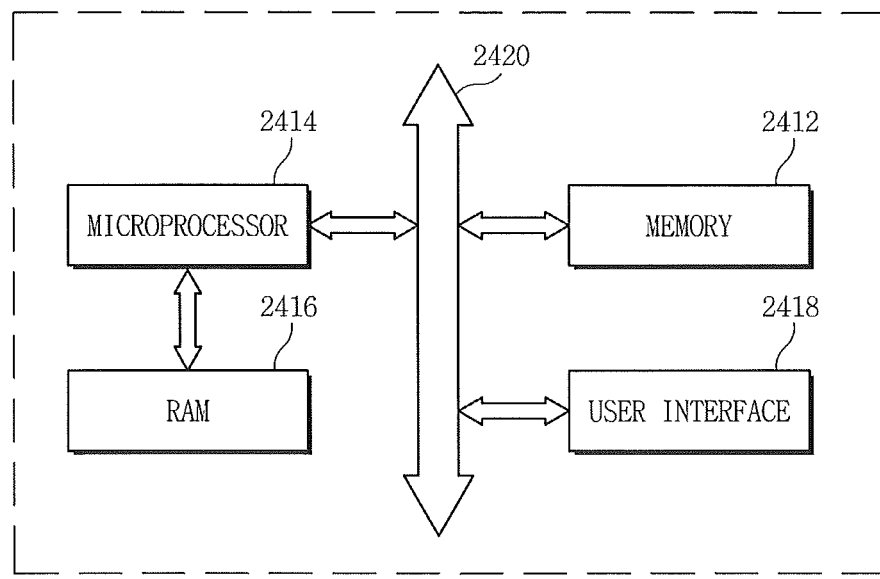

FIG. 8C is a block diagram schematically illustrating another electronic system 2400 including at least one of the semiconductor devices 10a and 10b in accordance with various embodiments described herein. Referring to FIG. 8C, the electronic system 2400 may include at least one of the semiconductor devices 10a and 10b in accordance with various embodiments. The electronic system 2400 may be used to fabricate a mobile apparatus or a computer. For example, the electronic system 2400 may include a memory system 2412, a microprocessor 2414, a random access memory (RAM) 2416, and a user interface 2418 performing data communication using a bus 2420. The microprocessor 2414 may program and control the electronic system 2400. The RAM 2416 may be used as an operation memory of the microprocessor 2414. For example, the microprocessor 2414 or the RAM 2416 may include at least one of the semiconductor devices 10a and 10b in accordance with some embodiments described herein. The microprocessor 2414, the RAM 2416, and/or other components may be assembled in a single package. The user interface 2418 may be used to input/output data to/from the electronic system 2400. The memory system 2412 may store codes for operating the microprocessor 2414, data processed by the microprocessor 2414, or external input data. The memory system 2412 may include a controller and a memory.

Figure 8D:
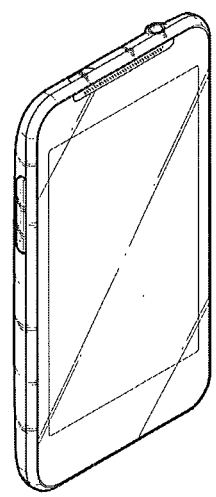
FIG. 8D is a diagram schematically illustrating a mobile apparatus including at least one of the semiconductor devices in accordance with various embodiments.

FIG. 8D is a diagram schematically illustrating a mobile apparatus 2500 including at least one of the semiconductor devices 10a and 10b in accordance with various embodiments described herein. Referring to FIG. 8D, the mobile apparatus 2500 may include at least one of the semiconductor devices 10a and 10b in accordance with various embodiments. The mobile apparatus 2500 may include a mobile phone or a tablet PC. In addition, at least one of the semiconductor devices 10a and 10b in accordance with various embodiments may be used in a portable computer such as a notebook (laptop), an MPEG-1 Audio Layer 3 (MP3) player, an MP4 player, a navigation apparatus, a solid state disk (SSD), a desktop computer, an automobile, and a home appliance, as well as the mobile phone or the tablet PC.

Because the semiconductor devices in accordance with various embodiments of the present inventive concepts include a resistor electrode having a metal, the resistor electrode may provide appropriate resistance for a small/fine-sized device.

In the methods of forming semiconductor devices in accordance with various embodiments of the present inventive concepts, because a metallic resistor electrode is formed before a gate structure, properties of the gate structure may be maintained without degradation.

In the methods of forming semiconductor devices in accordance with various embodiments of the present inventive concepts, the horizontal width and vertical thickness of the resistor electrode may be controlled using compatible processes with processes of forming other elements.

Because the methods of forming semiconductor devices in accordance with various embodiments of the present inventive concepts provide a process of forming a metallic resistor electrode compatible with a process of forming a gate structure, the process may be simplified.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device, comprising:
a transistor area and a resistor area,
wherein the transistor area comprises an active region in a substrate, and a gate structure on the active region,
wherein the resistor area comprises a base insulating layer on a surface of the substrate, and a resistor structure on the base insulating layer,
wherein the resistor structure comprises:
a conductive resistor electrode on the base insulating layer; and
an insulating resistor spacer on a side surface of the resistor electrode,
wherein the resistor spacer comprises an inner resistor spacer and an outer resistor spacer,
wherein the inner resistor spacer directly contacts the side surface of the resistor electrode and extends onto a top surface of the base insulating layer,
wherein the outer resistor spacer comprises silicon nitride and is on a side surface of the inner resistor spacer, and
wherein a top surface of the gate structure and a top surface of the resistor structure are substantially coplanar.

2. The semiconductor device of claim 1, further comprising:
a field region in the substrate, wherein the base insulating layer is on the field region.

3. The semiconductor device of claim 1, wherein the resistor structure further comprises a resistor surface insulating layer between the base insulating layer and the resistor electrode, the resistor surface insulating layer comprising silicon oxide.

4. The semiconductor device of claim 1, wherein the resistor area further comprises a resistor capping layer on a side surface of the resistor spacer, and on a side surface and a part of a top surface of the base insulating layer.

5. The semiconductor device of claim 1, wherein the gate structure comprises:
a gate electrode;
a U-shape gate insulating layer between the substrate and the gate electrode; and
a gate spacer on a side surface of the gate insulating layer.

6. The semiconductor device of claim 4, wherein the resistor capping layer extends onto the surface of the substrate and comprises silicon oxide.

7. The semiconductor device of claim 4, wherein the base insulating layer comprises:
a first surface contacting the resistor capping layer;
a second surface contacting the resistor spacer; and
a third surface overlapped by the resistor electrode,
wherein the first surface is lower than the second surface, and the third surface is higher than the second surface.

8. The semiconductor device of claim 5, wherein the gate structure further comprises a gate surface insulating layer between the surface of the substrate and the gate insulating layer.

9. The semiconductor device of claim 5, wherein the gate spacer comprises:
an inner gate spacer directly on a side surface of the gate insulating layer; and
an outer gate spacer on a side surface of the inner gate spacer, the outer gate spacer comprising silicon nitride.

10. The semiconductor device of claim 8, wherein the gate insulating layer comprises a metal oxide, and the gate surface insulating layer comprises oxidized silicon.

11. A semiconductor device, comprising:
a substrate comprising an active region and a field region;
a gate structure on the active region, wherein the gate structure comprises a conductive gate electrode, a gate insulating layer on a bottom surface and side surfaces of the gate electrode, and an insulating gate spacer on an outer side surface of the gate insulating layer;
a source/drain area in the active region and adjacent a side of the gate structure;
a base insulating layer on the field region; and
a resistor structure on the base insulating layer, wherein the resistor structure comprises a conductive resistor electrode on the base insulating layer and an insulating resistor spacer on a side surface of the resistor electrode,
wherein the gate electrode is thicker than the resistor electrode,
wherein the resistor spacer comprises an inner resistor spacer and an outer resistor spacer,
wherein the inner resistor spacer directly contacts the side surface of the resistor electrode and extends onto a top surface of the base insulating layer, and
wherein the outer resistor spacer comprises silicon nitride and is on a side surface of the inner resistor spacer.

12. The semiconductor device of claim 11, wherein the gate structure further comprises:
a gate surface insulating layer between a surface of the substrate and the gate insulating layer; and
a gate barrier layer between the gate insulating layer and the gate electrode,
wherein the gate surface insulating layer extends in a horizontal direction, and the gate barrier layer is on the bottom and side surfaces of the gate electrode.

13. The semiconductor device of claim 11, wherein
the resistor structure further comprises a resistor surface insulating layer between the base insulating layer and the resistor electrode, and extending in a horizontal direction.

14. A semiconductor device comprising:
a substrate comprising a transistor area and a resistor area;
a gate electrode on the substrate in the transistor area;
a resistor electrode on the substrate in the resistor area, the resistor electrode comprising an uppermost surface substantially coplanar with an uppermost surface of the gate electrode, and the resistor electrode further comprising a thinner thickness than a thickness of the gate electrode;
an insulating layer between the resistor electrode and a surface of the substrate, the insulating layer comprising an uppermost surface that is higher than a lowermost surface of the gate electrode, relative to the surface of the substrate;
a spacer on the resistor electrode; and
a resistor capping layer adjacent the spacer,
wherein the insulating layer between the resistor electrode and the surface of the substrate comprises a first insulating layer,
wherein the semiconductor device further comprises a second insulating layer between the gate electrode and the surface of the substrate,
wherein the first insulating layer comprises:
a wider width than a width of the second insulating layer; and
a thicker thickness than a thickness of the second insulating layer,
wherein the first insulating layer directly contacts the spacer and the resistor capping layer, and
wherein the resistor electrode comprises a metal.

15. The semiconductor device of claim 14, further comprising a third insulating layer between the first insulating layer and the resistor electrode, wherein the width of the first insulating layer is wider than a width of the third insulating layer, and wherein the thickness of the first insulating layer is thicker than a thickness of the third insulating layer.

16. The semiconductor device of claim 14, wherein the first insulating layer directly contacts the surface of the substrate.

* * * * *